United States Patent
Chen et al.

(10) Patent No.: US 10,168,410 B2
(45) Date of Patent: Jan. 1, 2019

(54) MRI DATA ACQUISITION, RECONSTRUCTION AND CORRECTION METHODS FOR DIFFUSION WEIGHTED IMAGINE (DWI) AND DIFFUSION TENSOR IMAGING (DTI) AND RELATED SYSTEMS

(75) Inventors: Nan-kuei Chen, Cary, NC (US);
Trong-Kha Truong, Durham, NC (US);
Allen W. Song, Chapel Hill, NC (US)

(73) Assignee: Duke University, Durham, NC (US)

( * ) Notice: Subject to any disclaimer, the term of this patent is extended or adjusted under 35 U.S.C. 154(b) by 1586 days.

(21) Appl. No.: 13/992,537

(22) PCT Filed: Dec. 20, 2011

(86) PCT No.: PCT/US2011/066019
§ 371 (c)(1),
(2), (4) Date: Jun. 7, 2013

(87) PCT Pub. No.: WO2012/088031
PCT Pub. Date: Jun. 28, 2012

(65) Prior Publication Data
US 2013/0249555 A1     Sep. 26, 2013

Related U.S. Application Data

(60) Provisional application No. 61/425,921, filed on Dec. 22, 2010.

(51) Int. Cl.
G01R 33/561 (2006.01)
G01R 33/58 (2006.01)
G01R 33/563 (2006.01)
G01R 33/565 (2006.01)

(52) U.S. Cl.
CPC ........ G01R 33/583 (2013.01); G01R 33/561 (2013.01); G01R 33/56341 (2013.01); G01R 33/56518 (2013.01); G01R 33/56536 (2013.01); G01R 33/5616 (2013.01); G01R 33/56554 (2013.01)

(58) Field of Classification Search
USPC .......................... 324/300–322; 600/407–435
See application file for complete search history.

(56) References Cited

U.S. PATENT DOCUMENTS

| | | | |
|---|---|---|---|
| 6,188,219 B1 | 2/2001 | Reeder et al. | |
| 6,975,113 B1 | 12/2005 | Gurr | |
| 8,405,395 B2* | 3/2013 | Setsompop | ........ G01R 33/4835 324/309 |
| 8,664,954 B2* | 3/2014 | Hetzer | ............... G01R 33/4818 324/309 |
| 9,329,252 B2* | 5/2016 | Bammer | ................ G01R 33/56 |

(Continued)

OTHER PUBLICATIONS

International Search Report for corresponding PCT Application No. PCT/US2011/066019, dated Jul. 20, 2012.

(Continued)

*Primary Examiner* — Melissa Koval
*Assistant Examiner* — Tiffany Fetzner
(74) *Attorney, Agent, or Firm* — Myers Bigel, P.A.

(57) ABSTRACT

Methods, systems, computer programs, circuits and workstations are configured to generate MRI images using gradient blips for signal acquisition and reconstruction using dynamic field mapping, TE corrections and/or multischeme partial Fourier images.

21 Claims, 14 Drawing Sheets

(56) References Cited

U.S. PATENT DOCUMENTS

| | | | |
|---|---|---|---|
| 9,414,766 B2* | 8/2016 | Jesmanowicz | A61B 5/055 |
| 9,778,338 B2* | 10/2017 | Setsompop | G01R 33/543 |
| 2005/0270027 A1 | 12/2005 | Truong et al. | |
| 2010/0188085 A1 | 7/2010 | Huo et al. | |
| 2011/0254548 A1* | 10/2011 | Setsompop | G01R 33/4835 |
| | | | 324/309 |
| 2012/0013336 A1* | 1/2012 | Hetzer | G01R 33/4818 |
| | | | 324/309 |
| 2012/0319686 A1* | 12/2012 | Jesmanowicz | A61B 5/055 |
| | | | 324/309 |
| 2013/0181710 A1* | 7/2013 | Setsompop | G01R 33/4835 |
| | | | 324/309 |
| 2013/0229177 A1* | 9/2013 | Bammer | G01R 33/56341 |
| | | | 324/309 |
| 2013/0249555 A1* | 9/2013 | Chen | G01R 33/561 |
| | | | 324/309 |

OTHER PUBLICATIONS

Andersson et al. "How to correct susceptibility distortions in spin-echo echo-planar images: application to diffusion tensor imaging", *NeuroImage*, vol. 20, Issue 2, Oct. 2003, 870-888.

Ardekani et al. "Geometric Distortion Correction of High-Resolution 3 T Diffusion Tensor Brain Images", *Magn Reson Med*, 54:1163-1171, 2005.

Basser et al. "MR Diffusion Tensor Spectroscopy and Imaging", *Biophysical Journal*, vol. 66, Jan. 1994, 259-267.

Bodammer et al. "Eddy Current Correction in Diffusion-Weighted Imaging Using Pairs of Images Acquired With Opposite Diffusion Gradient Polarity", *Magnetic Resonance in Medicine*, 51:188-193, 2004.

Chen et al. "Application of k-space energy spectrum analysis to susceptibility field mapping and distortion correction in gradient-echo EPI", *NeuroImage*, vol. 31, Issue 2, Jun. 2006, 609-622.

Chen et al. "Correction for direction-dependent distortions in diffusion tensor imaging using matched magnetic field maps", *NeuroImage*, vol. 30, Issue 1, Mar. 2006, 121-129.

Chen et al. "Improved Image Reconstruction for Partial Fourier Gradient-Echo Echo-Planar Imaging (EPI)", *Magnetic Resonance in Medicine*, 59:916-924, 2008.

Chien et al. "MR diffusion imaging of cerebral infarction in humans", *American Journal of Neuroradiology*, 1992, vol. 13, 1097-1102 (Abstract Only).

Moseley et al. "Early detection of regional cerebral ischemia in cats: Comparison of diffusion- and T2-weighted MRI and spectroscopy", *Magnetic Resonance in Medicine*, vol. 14, Issue 2, 330-346, May 1990.

Pierpaoli et al. "Diffusion Tensor MR Imaging of the Human Brain", *Radiology*, 1996; 201:637-648.

Reese et al. "Reduction of Eddy-Current-Induced Distortion in Diffusion MRI Using a Twice-Refocused Spin Echo", *Magn Reson Med*, 49:177-182, 2003.

Rohde et al. "Comprehensive Approach for Correction of Motion and Distortion in Diffusion-Weighted MRI", *Magn Reson Med*, 51:103-114, 2004.

Shen et al. "Correction of High-Order Eddy Current Induced Geometric Distortion in Diffusion-Weighted Echo-Planar Images", *Magn Reson Med*, 52:1184-1189, 2004.

Truong et al. "Integrated SENSE DTI with correction of susceptibility- and eddy current-induced geometric distortions", *NeuroImage*, vol. 40, Issue 1, Mar. 2008, 53-58.

Wansapura et al. "NMR Relaxation Times in the Human Brain at 3.0 Tesla", *J. Magn. Reson. Imaging*, 1999;9:531-538.

Warach et al. "Fast magnetic resonance diffusion-weighted imaging of acute human stroke", *Neurology*, Sep. 1992, 42(9):1717-1723 (Abstract Only).

Yablonskiy et al. "An MRI Method for Measuring T2 in the Presence of Static and RF Magnetic Field Inhomogeneities", *MRM*, 37:872-876, 1997.

\* cited by examiner

MRI DATA ACQUISITION, RECONSTRUCTION AND CORRECTION METHODS FOR DIFFUSION WEIGHTED IMAGINE (DWI) AND DIFFUSION TENSOR IMAGING (DTI) AND RELATED SYSTEMS

RELATED APPLICATIONS

This application is a 35 USC 371 national phase application of PCT/US2011/066019, filed Dec. 20, 2011, which claims the benefit of and priority to U.S. Provisional Application Ser. No. 61/425,921, filed Dec. 22, 2010, the contents of which are hereby incorporated by reference herein.

STATEMENT OF FEDERAL SUPPORT

The invention(s) was supported in part by funding provided under the National Institutes of Health under NIH Grant Nos. 1R01EB009483-01A2 and 5R21NS065344-02. The United States Government has certain rights to the invention(s).

BACKGROUND

The emergence of diffusion weighted imaging (DWI) and diffusion tensor imaging (DTI) provides a means via water diffusion to investigate the white matter integrity in the human brain and its impact on neuronal functions. Quantitative mapping of tissue diffusion properties, such as the apparent diffusion coefficient (ADC) and fractional anisotropy (FA) derived from DWI and DTI scans, is sensitive to the pathological changes in various diseases, and is therefore clinically valuable. The most successful application of the ADC mapping since the late 1980s and the early 1990s has been brain ischemia. For example, in 1990, Moseley et al. showed that the brain diffusion coefficient drops at a very early stage of the ischemic event, and in 1992, Chien et al. and Warach et al. showed that ADC mapping is clinically valuable in detecting early pathological changes in stroke patients. Since then the ADC mapping has been used in numerous stroke studies and its clinical value has been established. In 1994, Basser reported that the FA maps derived from DTI provide unique information on white matter integrity, and in 1996, Pierpaoli et al. showed that FA mapping is clinically valuable, particularly for improving the neuroradiologic assessment of a variety of white matter disorders. Since then, DTI has been widely used to assess white matter development and pathology. In order to improve the signal-to-noise ratio and reduce potential motion-related artifacts, human DWI and DTI data are usually acquired with partial Fourier echo-planar imaging (EPI). However, partial-Fourier EPI based DWI and DTI are susceptible to unique Type 1 and Type 2 artifacts as discussed in Chen et al., *Improved image reconstruction for partial fourier gradient-echo echo-planar imaging (EPI)*, Magnetic Resonance in Medicine 2008; 59; 916-924, and other types of artifact such as geometric distortions resulting from eddy current effect and field inhomogeneities. The artifacts may cause quantitative inaccuracies in MRI data acquired with conventional DWI and DTI protocols.

REFERENCES

M, E. Moseley, Y. Cohen, J. Mintorovitch, L. Chileuitt, H, Shimizu, J. Kucharczyk, M. F. Wendland, and P. R. Weinstein. Early detection of regional cerebral ischemia in cats: comparison of diffusion- and T2-weighted MRI and spectroscopy. Magn Reson Med, 14(2):330-46, 1990.

D. Chien, K. K. Kwong, D. R. Gress, F. S. Buonanno, R. B. Buxton, and B. R. Rosen. MR diffusion imaging of cerebral infarction in humans. AJNR Am J Neuroradiol, 13(4): 1097-102, 1992.

S. Warach, D. Chien, W. Li, M, Ronthal, and R. R. Edelman. Fast magnetic resonance diffusion weighted imaging of acute human stroke. Neurology, 42(9): 1717-23, 1992.

P. J. Basser, J. Mattiello, and D. LeBihan. MR diffusion tensor spectroscopy and imaging. Biophys J, 66(1):259-67, 1994.

C. Pierpaoli, P. Jezzard, P. J. Basser, A. Barnett, and G. Di Chiro. Diffusion tensor MR imaging of the human brain. Radiology, 201 (3):637-48, 1996.

SUMMARY OF EMBODIMENTS OF THE INVENTION

Embodiments of the invention are directed to methods of generating MRI images that include: (a) electronically acquiring MRI patient image data using defined gradient blips added to phase encoding gradients to correct for type 1 artifacts; (b) electronically mathematically combining a series of partial Fourier images reconstructed from the same acquired image data such that respective images each have k-space image data with the same matrix size (for reducing inconsistent scaling errors across partial Fourier images); (c) electronically adjusting the acquired image data using dynamic maps of the static magnetic field inhomogeneities induced by susceptibility effects and eddy currents within an acquisition window; and (d) electronically generating MRI images using image data from the partial Fourier images and the adjusted image data. In particular embodiments, step (b) can be carried out to generate DWI and DTI images that have reduced type 2 artifact (and those images may be generated to be substantially free of the type 2 artifact).

Optionally, the methods can further include electronically calibrating an MRI scanner used to acquire the MRI patient data using at least one calibration scan with defined pulse sequence parameters and a phantom held in a bore of magnet associated with the MRI scanner before the acquiring step to determine the defined gradient blips. The calibrating step can be configured to determine the gradient blips using a k-space energy spectrum analysis. The calibrating step may also include mapping the temporal dependence of the static magnetic field inhomogeneities induced by susceptibility effects and eddy currents within the acquisition window of DWI and DTI scans using the phantom.

The adjusting step can also include electronically applying a TE (echo time) correction to the acquired data by dividing the signal intensity of each pixel by a correction factor to thereby correct for type 3 artifacts. The TE correction may optionally use two different exponential functions that are selectively applied, based on eddy current-induced echo shifts to adjust the signal data.

The generating step may include generating a fractional anisotropy (FA) image of a brain or other body organs of the patient and/or a fiber tractography of a brain or other body organ of the patient.

The acquiring step may be carried out using DTI and/or DWI.

The dynamic mapping and correction protocol of the adjusting step can include acquiring a train of asymmetric spin-echo images at increasing echo times (TEs) spanning an acquisition time period (Tacq) using a moving window, and unwrapping the images along a TE (echo time) dimension. The unwrapping can be performed separately on odd and even echoes to thereby avoid errors due to off-resonance effects.

Optionally, the dynamic mapping and correction can also include multiplying uncorrected DTI images with defined exponential functions, then Fourier transforming the multiplied images to k-space, then extracting data from the transformed images to define a new k-space used to generate a corrected DTI image for the generated image.

Still other embodiments are directed to image processing circuits configured to electronically generate MRI images with reduced artifacts using: (i) blipped image acquisition for an MR Scanner to acquire MRI patient image data; and (ii) a reconstruction and correction protocol that:

(a) generates an image with reduced type 2 artifact through mathematically combining a series of partial Fourier transform (PFT) of images of the acquired MRI patient image data, wherein the PFT of the images is configured to create k-space images with the same matrix size to reduce scaling errors;

(b) applies a TE (echo time) correction factor to the acquired MRI image data to reduce type 3 artifacts, wherein the TE correction factor corrects for signal intensity changes due to variations of an effective echo time associated with type 3 artifacts; and (c) corrects for spatial and temporal variations of a static magnetic field associated with a magnet of the MR Scanner including those due to susceptibility effects and time-varying eddy currents, wherein the eddy current corrections use pre-acquired measures of temporal variations based on a dynamic mapping of the magnetic field.

The circuit can be at least partially integrated into or in communication with at least one of: (a) the MR Scanner; or (b) a clinician workstation.

The circuit can be configured to generate a fractional anisotropy (FA) image and/or a fiber tractography of a brain or other body organs of the patient based on the reconstruction and correction protocol. The acquired MRI images can be DWI/DTI images.

Yet additional aspects of the invention are directed to MR image processing systems. The systems include an MR Scanner configured with defined gradient blips obtained from a calibration scan using a phantom to be used for signal acquisition of DTI/DWI clinical images.

The MR Scanner may also be configured with data from dynamic field mapping of a static magnetic field of the MR Scanner to provide measures of temporal variations associated with eddy current-induced artifacts using the phantom and defined DTI/DWI image parameters.

The systems can include a workstation in communication with the MR Scanner. The workstation and/or Scanner can be configured with an image processing circuit that applies a reconstruction and correction protocol that:

(a) generates an image with reduced type 2 artifact through mathematically combining a series of partial Fourier transform (PFT) of images of acquired DTI/DWI MRI patient image data, wherein the PFT of the images is configured to create k-space images with the same matrix size to reduce scaling errors;

(b) applies a TE (echo time) correction factor to the acquired MRI image data to reduce type 3 artifacts, wherein the TE correction factor corrects for signal intensity changes due to variations of an effective echo time associated with type 3 artifacts; and (c) corrects for spatial and temporal variations of a static magnetic field associated with a magnet of the MR Scanner including those due to susceptibility effects and eddy current using pre-acquired measures of temporal variations associated with eddy currents.

The MR Scanner or workstation can be configured to generate a fractional anisotropy (FA) image and/or a fiber tractography of a brain or other body organs of the patient with image data acquired using the defined gradient blips for the acquired DTI/DWI signal acquisition.

Still other aspects of the application are directed to data processing systems that include a non-transient computer readable storage medium having computer readable program code embodied in the medium. The computer-readable program code includes: computer readable program code configured to acquire DTI/DWI MRI signals using pre-defined gradient blips to adjust acquisition windows. The gradient blips can vary in diffusion direction and slice number, and the gradient blips correct for signal loss due to a shift of an echo outside the acquired k-space such that a shifted echo using the gradient blip remains within an acquired k-space.

Yet other aspects of the invention are directed to methods of generating clinical DWI/DTI MRI brain images. The methods include: (a) acquiring MRI image data of a patient's brain using pre-defined gradient blips, one added to each of a first phase-encoding gradient of an EPI (echo planar imaging) readout for adjusting acquisition windows to correct for type 1 artifacts; (b) reconstructing the acquired MRI image data using a series of partial Fourier images adjusted to reduce type 2 artifacts; (c) adjusting the MRI image data using an echo time correction factor that corrects for signal intensity changes due to variations of effective echo time associated with type 3 artifacts; (d) adjusting the MRI image data using data from a dynamic magnetic field mapping of measures of spatial and temporal variations of the magnetic field associated with susceptibility effects and eddy currents; and (e) generating brain images of a patient using the reconstructed and adjusted image data.

Embodiments of the invention are directed to DWI and/or DTI imaging protocols that can improve MRI brain image data. Embodiments of the invention reduce the quantitative inaccuracy in MRI data acquired with previous diffusion-weighted imaging (DWI) and/or diffusion tensor imaging (DTI) protocols.

Embodiments of the invention can simultaneously reduce artifacts resulting from both system-dependent eddy current effect and subject-dependent susceptibility field gradients in DWI and DTI signal acquisitions. Embodiments of the invention provide DTI and/or DWI data with higher SNR and improved quantitative accuracy.

It is noted that aspects of the invention described with respect to one embodiment, may be incorporated in a different embodiment although not specifically described relative thereto. That is, all embodiments and/or features of any embodiment can be combined in any way and/or combination. Further, any feature or sub-feature claimed with respect to one claim may be included in another future claim without reservation and such shall be deemed supported in the claims as filed. Thus, for example, any feature claimed with respect to a method claim can be alternatively claimed as part of a system, circuit, computer readable program code or workstation. Applicant reserves the right to change any originally filed claim or file any new claim accordingly, including the right to be able to amend any originally filed claim to depend from and/or incorporate any feature of any other claim although not originally claimed in that manner.

These and other objects and/or aspects of the present invention are explained in detail in the specification set forth below.

The foregoing and other objects and aspects of the present invention are explained in detail herein.

BRIEF DESCRIPTION OF THE DRAWINGS

FIG. 2A illustrates a Type 1 artifact. FIG. 2C illustrates a type 2 artifact. FIG. 2B illustrates a blipped DTI acquisition according to embodiments of the present invention. FIG. 2D illustrates a multischeme partial Fourier image reconstruction according to embodiments of the present invention.

FIG. 4A shows the data with 28 overscans. FIG. 4B shows the data with 12 overscans. FIG. 4C shows the data with 12 overscans and blips according to embodiments of the present invention.

FIG. 5A are DTI images with 28 overscans. FIG. 5B are DTI images with 12 overscans. FIG. 5C are DTI images with 12 overscans and with blips according to embodiments of the present invention. FIG. 5D are DTI images with 12 overscans and with blips and multischeme PF reconstruction according to embodiments of the present invention.

FIG. 6A shows the map for 28 overscans. FIG. 6B shows the map for 12 overscans.

FIG. 7A shows the maps for 28 overscans. FIG. 7B shows the maps for 8 overscans. FIG. 7C shows the maps for 8 overscans with blips and multischeme PF reconstruction according to embodiments of the present invention. FIG. 7D shows the maps for 8 overscans with blips with multischeme PF reconstruction and TE correction, according to embodiments of the present invention.

FIG. 11A shows a map without correction. FIG. 11B shows the maps with a static correction. FIG. 11C shows the maps with a dynamic correction according to embodiments of the present invention.

FIG. 12A shows FA difference maps for no correction vs. dynamic correction. FIG. 12B shows the maps with static versus dynamic correction according to embodiments of the present invention.

DETAILED DESCRIPTION

Figure 1:
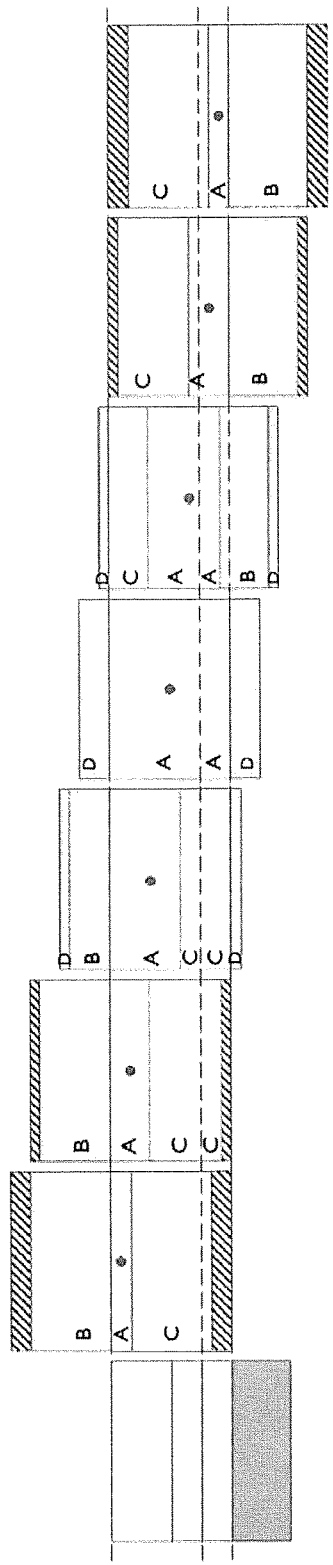
FIG. 1 is a schematic diagram of a series of k-space image data showing an improved multischeme partial Fourier reconstruction method that can reduce scaling errors according to embodiments of the present invention.

The present invention will now be described more fully hereinafter with reference to the accompanying figures, in which embodiments of the invention are shown. This invention may, however, be embodied in many different forms and should not be construed as limited to the embodiments set forth herein. Like numbers refer to like elements throughout. In the figures, certain layers, components or features may be exaggerated for clarity, and broken lines illustrate optional features or operations unless specified otherwise. In addition, the sequence of operations (or steps) is not limited to the order presented in the figures and/or claims unless specifically indicated otherwise. In the drawings, the thickness of lines, layers, features, components and/or regions may be exaggerated for clarity and broken lines illustrate optional features or operations, unless specified otherwise. Features described with respect to one figure or embodiment can be associated with another embodiment of figure although not specifically described or shown as such.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items.

It will be understood that although the terms "first" and "second" are used herein to describe various actions, steps or components and should not be limited by these terms. These terms are only used to distinguish one action, step or component from another action, step or component. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

The term "circuit" refers to an entirely software embodiment or an embodiment combining software and hardware aspects, features and/or components (including, for example, a processor and software associated therewith embedded therein and/or executable by, for programmatically directing and/or performing certain described actions or method steps).

The term "programmatically" means that the operation or step can be directed and/or carried out by a digital signal processor and/or computer program code. Similarly, the term "electronically" means that the step or operation can be carried out in an automated manner using electronic components rather than manually or using any mental steps.

The terms "MRI scanner" or MR scanner" are used interchangeably to refer to a Magnetic Resonance Imaging system and includes the high-field magnet and the operating components, e.g., the RF amplifier, gradient amplifiers and processors that typically direct the pulse sequences and select the scan planes. Examples of current commercial scanners include: GE Healthcare: Signa 1.5T/3.0T; Philips Medical Systems: Achieva 1.5T/3.0T; Integra 1.5T; Siemens: MAGNETOM Avanto; MAGNETOM Espree; MAGNETOM Symphony; MAGNETOM Trio; and MAGNETOM Verio. As is well known, the MR scanner can include a main operating/control system that is housed in one or more cabinets that reside in an MR control room while the MRI magnet resides in the MR scan suite. The control room and scan room can be referred to as an MR suite and the two rooms can be separated by an RF shield wall. The term "high-magnetic field" refers to field strengths above about 0.5 T, typically above 1.0T, and more typically between about 1.5T and 10T. Embodiments of the invention may be particularly suitable for 1.5T and 3.0T systems, or higher field systems such as future contemplated systems at 4.0T, 5.0T, 6.0T and the like. The methods and systems can also be applied to animal MRI data acquired from animal MRI scanners. The term "patient" refers to humans and animals.

The term "automatically" means that the operation can be substantially, and typically entirely, carried out without manual input, and is typically programmatically directed and/or carried out. The term "electronically" with respect to connections includes both wireless and wired connections between components.

The term "clinician" means physician, radiologist, physicist, or other medical personnel desiring to review medical data of a patient. The term "workstation" refers to a display and/or computer associated with a clinician.

The term "calibration scan" refers to one or more scans that are carried out using certain pulse sequences and a phantom or phantoms to define certain operational parameters of the Scanner. The calibration scan is typically carried out prior to a diagnostic scan of a patient.

The term "reconstruction" is used broadly to refer to original or post-acquisition and storage and subsequent construction of image slices or images of an image data set.

The term "type 1 artifact" refers to signal loss associated with when an echo is shifted outside the acquired k-space.

The term "type 2 artifact" refers to partial Fourier reconstruction errors if the echo is shifted outside the central k-space band from which the background phase is computed.

The term "type 3 artifact" refers to variations of the effective echo time so that the acquired echo is an asymmetric spin-echo with an additional $T_2^*$-weighting rather than a pure spin-echo.

The term "blip" and derivatives thereof refer to a gradient adjustment added to a (typically first) phase-encoding gradient of an EPI (echo planar imaging) readout to adjust an acquisition window such that a shifted echo remains within an acquired k-space. The blip adjustment can be used to correct for type 1 artifacts. The size of the blip can vary with (diffusion) direction and slice number. As eddy currents are subject-independent, this calibration may only be performed once, such as during set-up using a suitable phantom, e.g., a spherical gel phantom, and substantially the same parameters as the subsequent imaging scan, e.g., a DTI scan. This blip calibration protocol can be carried out before each patient, at desired intervals during the day, such as between imaging sessions, daily, once per shift, weekly, monthly or once at initial installation (assuming low equipment drift).

The term "protocol" refers to an automated electronic algorithm (typically a computer program) with mathematical computations, defined rules for data interrogation and analysis that manipulates MRI image data to reduce image artifacts.

The term "multischeme" with respect to partial Fourier reconstructions means 1) performing a series of EPI partial Fourier reconstruction with background phases estimated from different portions of the k-space area, and followed by 2) mathematically combining all the reconstructed partial-Fourier EPI images (on a voxel-by-voxel basis) with each voxel-wise signal extracted from a partial Fourier image with its background-phase-estimating k-space portion matching the corresponding local echo-shifting effect, to generate a final image free from type 2 artifact.

Each article, reference and patent cited or discussed herein is hereby incorporated by reference as if recited in full herein. It is also noted, for clarity, that while certain of the figures are described as "color" or "color-coded", to comply with filing rules, black and white copies or grey scale versions of these images are used in support of the application.

Embodiments of the present invention may take the form of an entirely software embodiment or an embodiment combining software and hardware aspects, all generally referred to herein as a "circuit" or "module." Furthermore, the present invention may take the form of a computer program product on a computer-usable storage medium having computer-usable program code embodied in the medium. Any suitable computer readable medium may be utilized including hard disks, CD-ROMs, optical storage devices, a transmission media such as those supporting the Internet or an intranet, or magnetic storage devices. Some circuits, modules or routines may be written in assembly language or even micro-code to enhance performance and/or memory usage. It will be further appreciated that the functionality of any or all of the program modules may also be implemented using discrete hardware components, one or more application specific integrated circuits (ASICs), or a programmed digital signal processor or microcontroller. Embodiments of the present invention are not limited to a particular programming language.

Computer program code for carrying out operations of the present invention may be written in an object oriented programming language such as Java®, Smalltalk or C++. However, the computer program code for carrying out operations of the present invention may also be written in conventional procedural programming languages, such as the "C" programming language. The program code may execute entirely on the user's computer, partly on the user's computer, as a stand-alone software package, partly on the user's computer and partly on another computer, local and/or remote or entirely on the other local or remote computer. In the latter scenario, the other local or remote computer may be connected to the user's computer through a local area network (LAN) or a wide area network (WAN), or the connection may be made to an external computer (for example, through the Internet using an Internet Service Provider).

Embodiments of the present invention are described herein, in part, with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing some or all of the functions/acts specified in the flowchart and/or block diagram block or blocks.

The flowcharts and block diagrams of certain of the figures herein illustrate exemplary architecture, functionality, and operation of possible implementations of embodiments of the present invention. In this regard, each block in the flow charts or block diagrams represents a module, segment, or portion of code, which comprises one or more executable instructions for implementing the specified logical function(s). It should also be noted that in some alternative implementations, the functions noted in the blocks may occur out of the order noted in the figures. For example, two blocks shown in succession may in fact be executed substantially concurrently or the blocks may sometimes be executed in the reverse order or two or more blocks may be combined, or a block divided and performed separately, depending upon the functionality involved.

Generally stated, embodiments of the invention are designed to reduce, if not eliminate, the quantitative inaccuracy in MRI data acquired with the current diffusion-weighted imaging (DWI) and diffusion tensor imaging (DTI) protocols.

DWI and DTI, with their capability in detecting microstructural lesions, are now routinely used in many clinical exams, for example in staging the stroke. However, when acquiring the DWI and DTI data, the applied strong diffusion sensitizing gradients result in significant and undesirable eddy current effects, which in turn interfere with the MRI spatial encoding gradients, leading to multiple types of artifacts in the acquired images. As a result, the accuracy and reliability of the current clinical DWI and DTI protocols are less than optimal.

Embodiments of the invention can reduce, and may eliminate, various types of artifacts resulting from both system-dependent eddy current effect and subject-dependent susceptibility field gradients in DWI and DTI acquisitions. The acquired DWI and DTI data can have higher signal to noise ratio and significantly improved quantitative accuracy relative to prior DWI and/or DTI protocols.

Embodiments of the invention are directed to magnetic resonance imaging acquisition and reconstruction methods. The methods can include one or more (typically at least three and, more typically, all) of the following components:

1. A blipped acquisition method to correct for signal loss due to a shift of the echo outside the acquired k-space (type 1 artifact);
2. An improved multischeme partial Fourier reconstruction method to correct for partial Fourier reconstruction errors due to a shift of the echo outside the central k-space band from which the background phase is computed (type 2 artifact);
3. An echo time correction method to correct for signal intensity changes due to variations of the effective echo time (type 3 artifact);
4. A dynamic magnetic field mapping method to measure the spatial and temporal variations of the static magnetic field, including those due to susceptibility effects and eddy currents; and
5. A dynamic artifact correction method to correct for geometric distortions, blurring, and misregistration errors due to spatial and temporal variations of the static magnetic field.

Particular methods and/or features that can be used for components 1-3 are described below under the header entitled "Comprehensive correction of artifacts due to eddy current-induced echo shifts in partial Fourier DTI."

Particular methods and/or features for components 4 and 5 are described below under the header entitled "Dynamic correction of artifacts due to susceptibility effects and time-varying eddy currents in DTI."

In contrast to a previously proposed multischeme partial Fourier reconstruction method, embodiments of the invention can use a multischeme partial Fourier reconstruction method to further correct for scaling errors. Referring to FIG. 1, more particularly, in the past, the background phase was computed in a k-space band (FIG. 1, region A) centered on the shifted echo (which is indicated by the solid dot) rather than on the center of k-space, and the missing data (FIG. 1, region B) are generated from the data in the acquired k-space (regions A and C). This procedure is repeated for all possible echo shifts to generate a series of partial Fourier images. These images, which have a different matrix size in the phase-encoding direction, are interpolated to the same matrix size as that of the image to be reconstructed. The final (or resulting) image is then formed by extracting each pixel from the appropriate partial Fourier image according to its echo shift. However, this method can lead to scaling errors resulting from the different matrix sizes.

In some embodiments, a proposed improved multischeme partial Fourier reconstruction is configured so that the k-space data generated after partial Fourier reconstruction is either truncated (indicated uppermost and lowermost densely striped regions in FIG. 1) or zero-filled (regions D on segments not having truncated regions) such that it has the same matrix size as that of the image to be reconstructed. As such, all resulting partial Fourier images have the same matrix size and scaling errors in the final image are corrected for.

Also, with respect to component 4 and/or 5, in contrast to prior proposed static magnetic field mapping and artifact correction, embodiments of the invention provide a dynamic field mapping and artifact correction which can dynamically measure and correct for temporal as well as spatial variations of the static magnetic field, such as those due to eddy currents.

Embodiments of the invention can effectively and efficiently correct for multiple types of artifacts (including signal loss, partial Fourier reconstruction errors, signal intensity variations, geometric distortions, blurring, misregistration, and errors in the derivation of the diffusion tensor and in subsequent calculations such as fiber tractography), due to spatial and temporal variations of the static magnetic field, including, but not limited to, those caused by susceptibility effects and eddy currents, in diffusion-weighted magnetic resonance imaging, including diffusion tensor imaging.

Embodiments of the invention are widely applicable to a range of acquisition methods, including, but not limited to, echo-planar imaging and spiral imaging, although components 1 and 2 are more particularly suitable for partial Fourier echo-planar imaging. Furthermore, the methods are compatible with parallel imaging techniques.

Comprehensive Correction of Artifacts due to Eddy Current-Induced Echo Shifts in Partial Fourier DTI Partial Fourier (PF) echo-planar imaging (EPI) is typically used in diffusion tensor imaging (DTI) to reduce the TE (echo time) and increase the signal-to-noise ratio (SNR). However, eddy currents induced by the diffusion gradients can result in a shift of the echo from the center of k-space.

Figure 2:
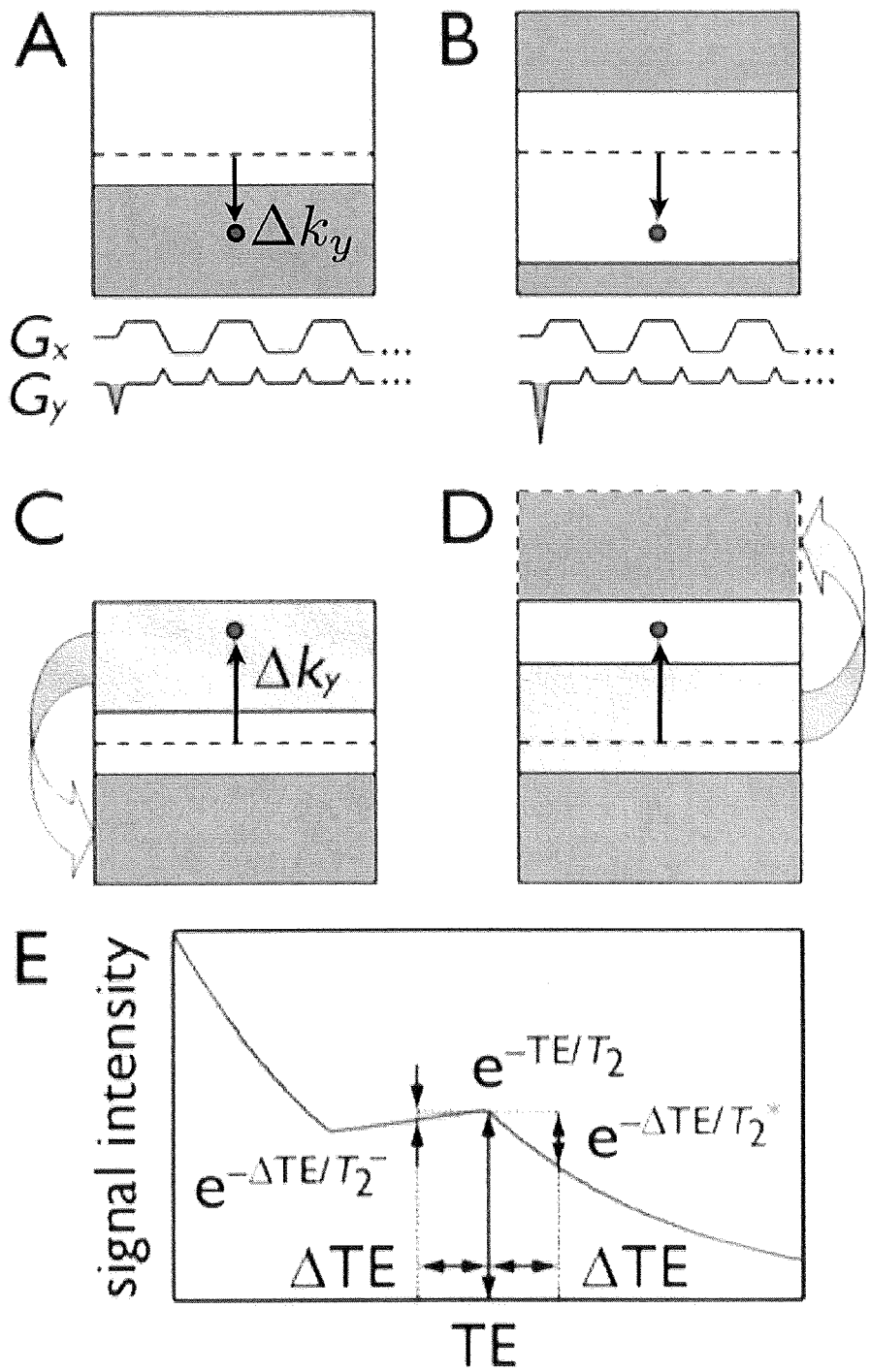
FIGS. 2A-2D are schematic illustrations of k-space.
FIG. 2E is a graph of signal intensity versus TE (echo time) and illustrates a type 3 artifact.

Echo shifts along the phase-encoding direction $\Delta k_y$ in turn lead to: (i) signal loss if the echo is shifted outside the acquired k-space (FIG. 2A, upper box with broken line) (type 1 artifact), (ii) PF reconstruction errors if the echo is shifted outside the central k-space band from which the background phase is computed (FIG. 2C, middle box with broken line) (type 2 artifact), and (iii) an increase or decrease of the effective TE, so that the acquired echo is an asymmetric spin-echo with an additional $T_2^*$-weighting rather than a pure spin-echo (FIG. 2E) (type 3 artifact).

All three types of artifact vary with spatial location and diffusion direction, leading to errors in the derivation of the diffusion tensor and consequently in fractional anisotropy (FA) maps and in fiber tractography. To avoid such artifacts, a large number of overscans (i.e., number of $k_y$ lines acquired before the $k_y=0$ line) is typically required, thereby greatly limiting the benefits of PF imaging. Embodiments of the invention describe a novel PF-DTI acquisition and post-processing method that can correct for all three types of artifact while maintaining a small number of overscans and hence a high SNR.

Methods

To correct for type 1 artifacts, a gradient blip is added to the first phase-encoding gradient of the EPI readout (FIG. 2B, shaded peak on Gy graph is the "blip") to adjust the readout window such that the shifted echo remains within the acquired k-space (shifted box from FIG. 2A with broken line in FIG. 2B). The appropriate blip depends on $\Delta k_y$ and varies with diffusion direction and slice number. To measure $\Delta k_y$ and determine the blips, a k-space energy spectrum analysis (KESA) (Chen, NeuroImage 2006; 31:609) can be used that can inherently measure the eddy current-induced echo shifts from the DTI k-space data. Since the eddy currents are subject-independent, this calibration only needs to be performed once on a (spherical gel) phantom using the same parameters as the DTI scan. That is, the calibration can be carried out at set-up or installation of the Scanner, quarterly, monthly, daily or at other desired intervals or triggered by equipment service or repair. The gradient blips can be provided as a stored system resource used by subsequent clinical scans for patients.

To correct for type 2 artifacts, a multischeme PF reconstruction method (Chen, MRM, 2008; 59:916) is used, in which the background phase is computed in a k-space band centered on the shifted echo (FIG. 2D, smaller rectangular box area with dot rather than on the $k_y=0$ line. This procedure is repeated for all possible $\Delta k_y$ values to generate a series of PF images. Depending on the magnitude of $\Delta k_y$, the missing data can be generated on the other side of k-space (arrow). The final (e.g., resulting) image is then formed by extracting each pixel from the appropriate PF image according to its $\Delta k_y$ value, which is obtained from a $\Delta k_y$ map computed with KESA from the DTI data.

To correct for type 3 artifacts, a TE correction is performed by dividing the signal intensity of each pixel by either $\exp(-\Delta TE/T_2^*)$ or $\exp(-\Delta TE/T_2^-)$ depending on the sign of $\Delta k_y$ (FIG. 2E), where $1/T_2^*=1/T_2+1/T_2'$ and $1/T_2^-=1/T_2-1/T_2'$ (Yablonskiy, M R M, 1997; 37:872). ATE is computed as $|\Delta k_y| T_{esp}$, where $\Delta k_y$ is obtained from the $\Delta k_y$ map and $T_{esp}$ is the echo spacing of the EPI readout.

Three DTI scans of a healthy volunteer were performed on a 3T GE scanner using 28 overscans (TE=103 ms), 12 overscans (TE=73 ms), and 12 overscans with blips, as well as TR=4s, matrix size=96×96, voxel size=(2.5 mm)$^3$, 20 slices, b=1000 s/mm$^2$, 15 diffusion directions, and $T_{esp}$=944 μs. The phantom DTI scan was performed using 28 overscans. The TE correction assumed that $T_2/T_2^*$=80/47 ms for white matter (Wansapura, JMRI, 1999; 9:531).

Results and Discussion

Figure 3:
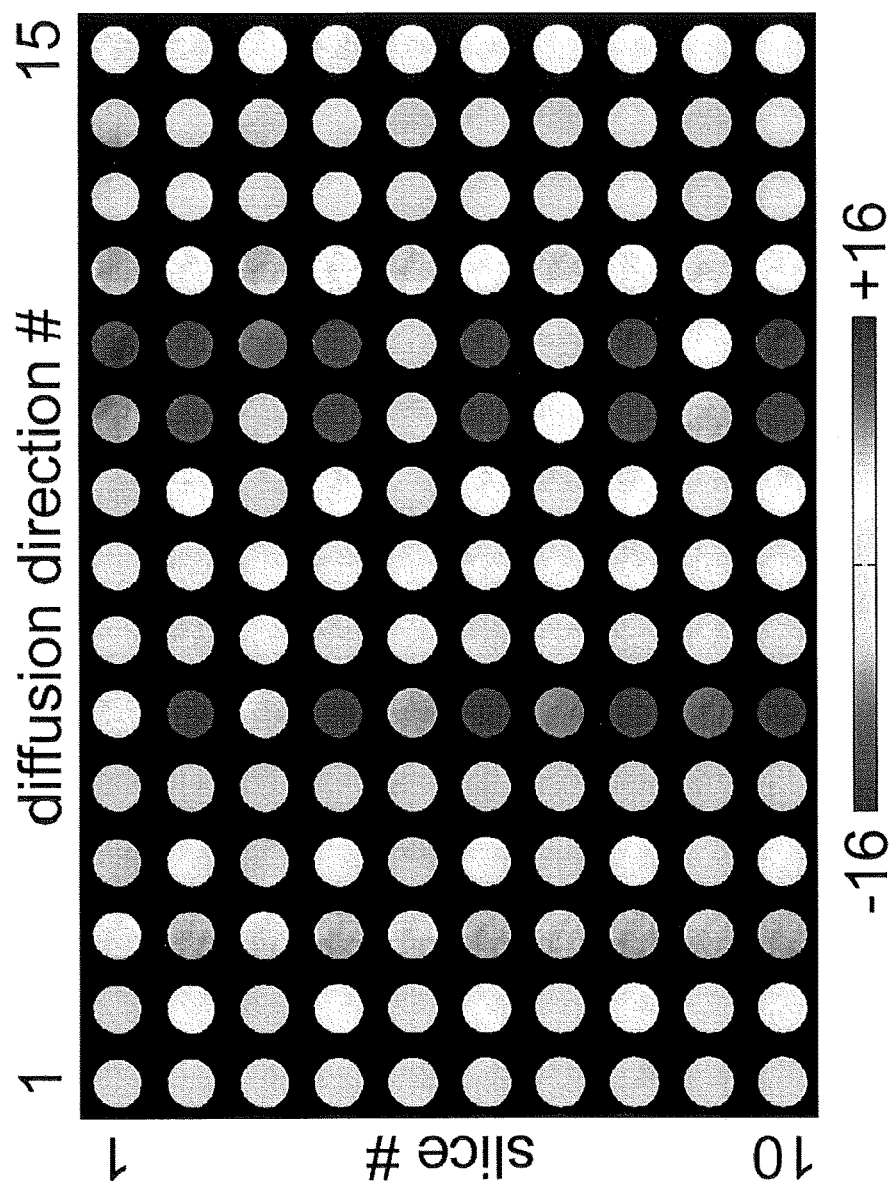
FIG. 3 is a color-coded grid (shown in gray scale) of Δky maps for 15 diffusion directions and 10 slices.

The phantom $\Delta k_y$ maps show that $\Delta k_y$ varies significantly with the diffusion direction and slice number (FIG. 3). FIG. 3 shows $\Delta k_y$ maps for 15 diffusion directions and the first 10 slices (out of 20). The variation is larger for odd slices, which were acquired first in this interleaved acquisition, and decreases for even slices, when long time constant (>200 ms) eddy currents extending over multiple slice acquisitions reach a steady-state.

Figure 4:
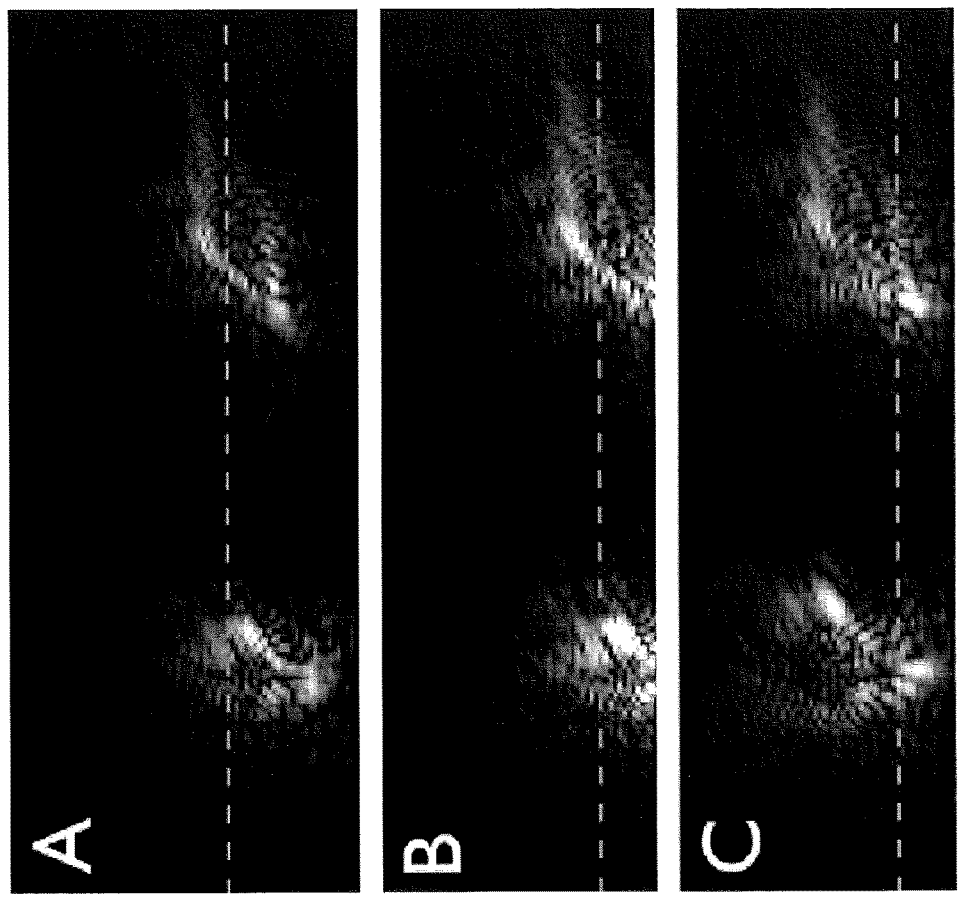
FIG. 4 shows images of k-space data for two diffusion directions.
Figure 5:
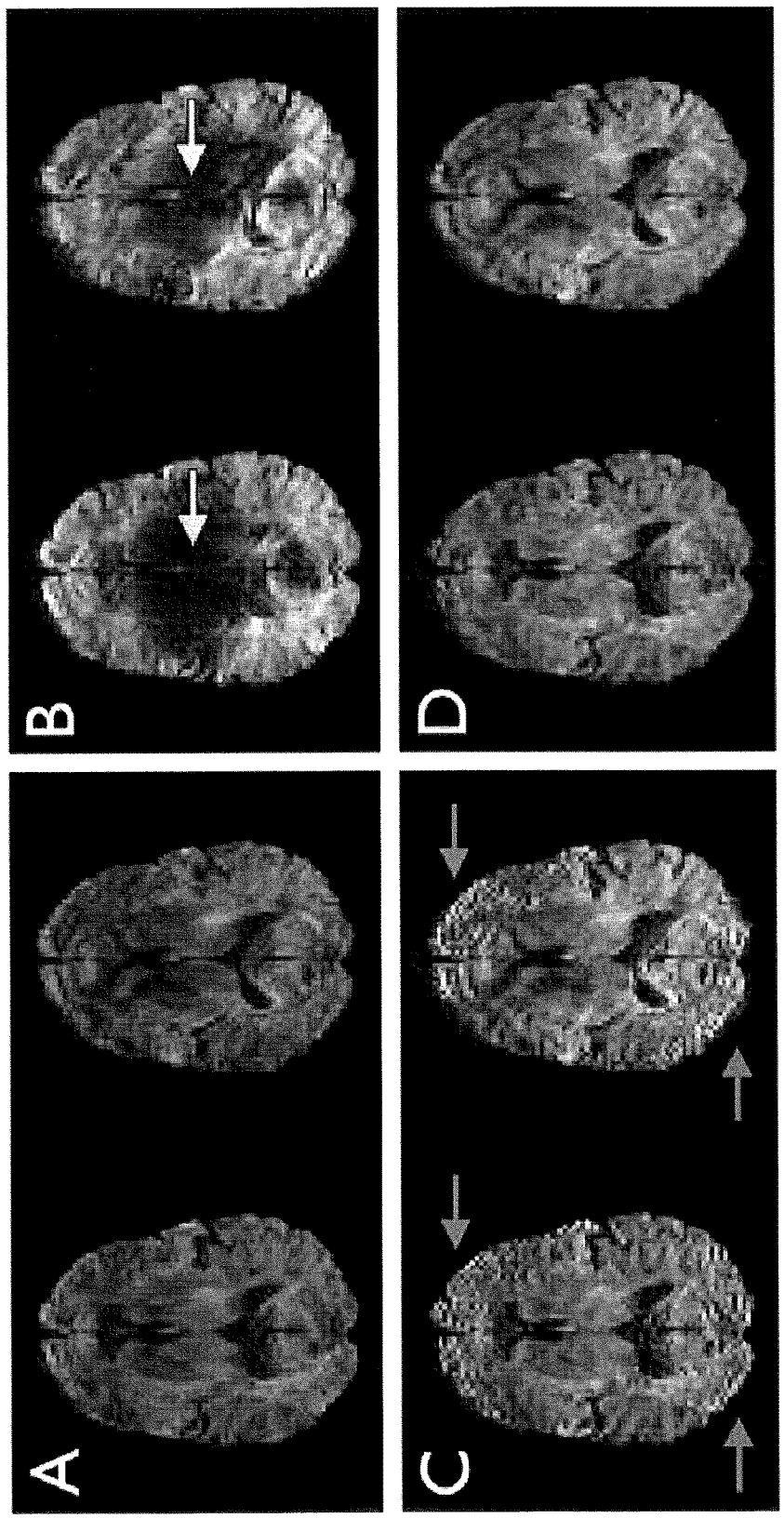
FIG. 5 shows DTI images at the same scale.
Figure 6:
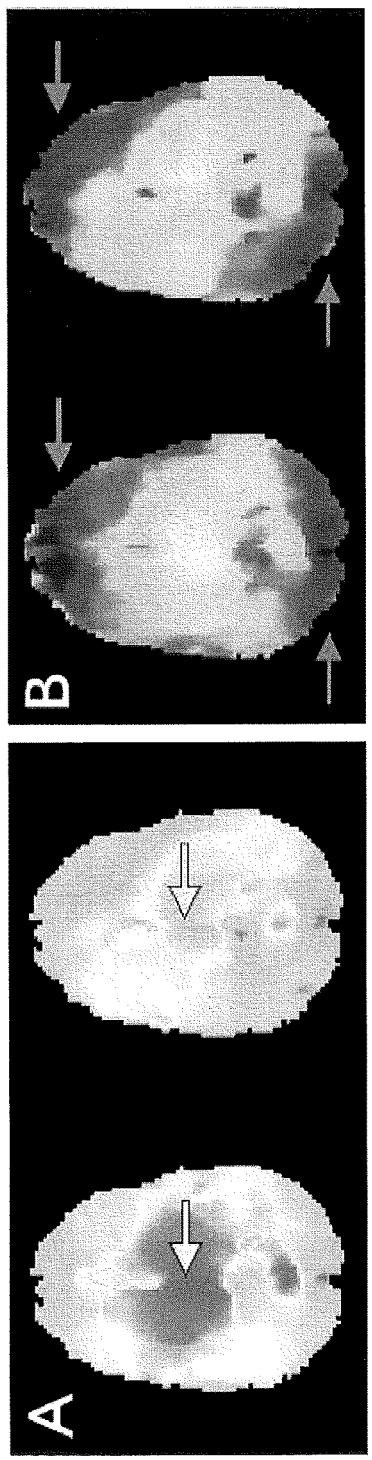
FIG. 6 shows Δky maps with the same scale as FIG. 2.

Representative in vivo results are shown in FIGS. 4-6 for two diffusion directions. FIG. 4 shows k-space data for two diffusion directions (6 & 12) and 28 overscans (A), 12 overscans (B), and 12 overscans with blips (C). FIG. 5 shows DTI images for 28 overscans (A), 12 overscans (B), 12 overscans with blips (C), and 12 overscans with blips and multischeme PF reconstruction (D). The same scaling is used in FIG. 5. FIG. 6 shows $\Delta k_y$ maps for 28 overscans (A) and 12 overscans with blips (B). FIG. 6 has the same scaling as in FIG. 2.

With 28 overscans, the echoes are shifted from the $k_y=0$ line (FIG. 4A, dashed line), but remain within the acquired k-space, and the reconstructed images have a low SNR because of the long TE (FIG. 5A). With 12 overscans, the echoes are shifted outside the acquired k-space (FIG. 4B), resulting in severe type 1 artifacts (FIG. 5B, arrows). By adding appropriate blips, the echoes are shifted back to the $k_y=0$ line (FIG. 4C) and the signal loss is recovered, but type 2 artifacts remain (FIG. 5C, arrows). By using the multischeme PF reconstruction, both types of artifacts are effectively corrected for and the SNR is increased by ~30% because of the shorter TE (FIG. 5D).

The $\Delta k_y$ maps show that for 28 overscans, regions with $\Delta k_y>0$ (FIG. 6A, arrows) correspond to type 1 artifacts, whereas for 12 overscans with blips, regions with $\Delta k_y<0$ (FIG. 6B, arrows) correspond to type 2 artifacts, as expected.

Figure 7:
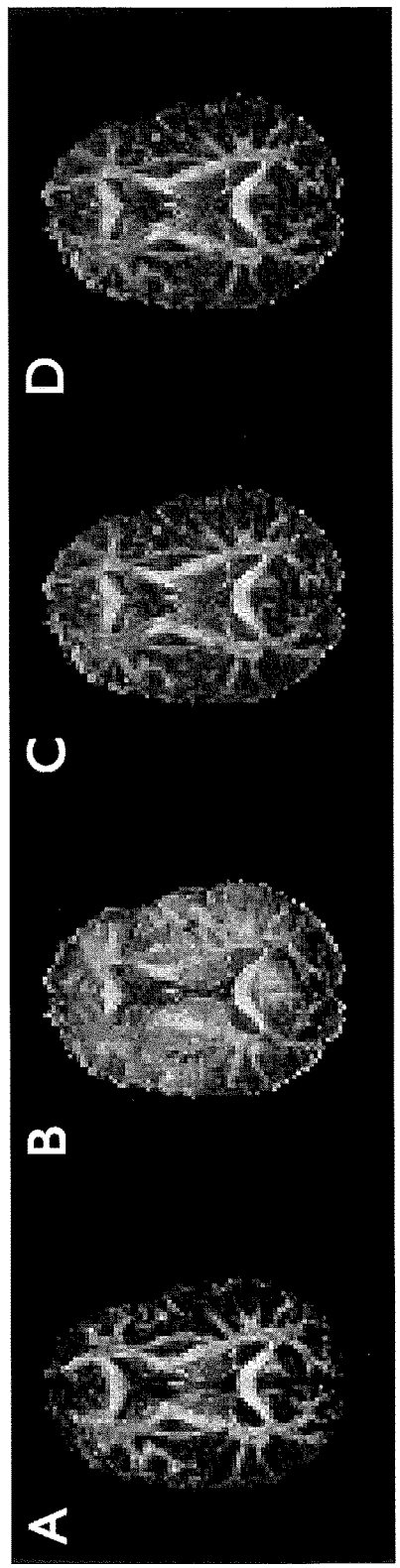
FIG. 7 shows color-coded FA maps (in black and white).

FIG. 7 shows color-coded fractional anisotropy (FA) maps. FIG. 7A shows the map for 28 overscans. FIG. 7B shows the map for 8 overscans. FIG. 7C shows the map for 8 overscans with blips and multi-scheme PF reconstruction. FIG. 7D shows 8 overscans with blips multischeme PF reconstruction, and TE correction.

With 28 overscans, the FA map has a low SNR because of the long TE (FIG. 7A), whereas with 8 overscans, type 1 artifacts lead to substantial FA errors (FIG. 7B, global signal increases). By using blips and multischeme PF reconstruction, type 1 and 2 artifacts are corrected for, but type 3 artifacts still result in FA errors (FIG. 7C), as $\Delta TE$ can reach up to 30 ms. After TE correction, all three types of artifact are corrected for (FIG. 7D).

These results demonstrate that the proposed PF-DTI acquisition and post-processing methods can effectively correct for all three types of artifact caused by eddy current-induced echo shifts while maintaining a high SNR.

Dynamic Correction of Artifacts due to Susceptibility Effects and Time-Varying Eddy Currents in DTI Diffusion tensor imaging (DTI) is a powerful technique for assessing white matter connectivity and integrity non-invasively. However, it is vulnerable to spatial and temporal variations of the static magnetic field ($B_0$) caused by susceptibility effects near air/tissue interfaces, $B_0^{SUSC}(x)$, and eddy currents induced by the diffusion gradients, $B_0^{EDDY}(x, t, d)$. The dependence on space (x), time (t), and diffusion direction (d) causes distortions, blurring, and misregistration among diffusion-weighted images, which in turn lead to errors in the derivation of the diffusion tensor and consequently in fractional anisotropy (FA) maps and in fiber tractography.

Existing correction methods such as $B_0$ mapping (Chen, NeuroImage, 2006; 30:121 and Truong, NeuroImage, 2008; 40:53), reversed gradient polarity (Bodammer, MRM, 2004; 51:188; Shen, MRM, 2004; 52:1184 and Andersson, NeuroImage, 2003; 20:870), and post-processing (Rohde, MRM, 2004; 51:103 and Ardekani, MRM, 2005; 54:1163) assume that $B_0^{EDDY}$ remains constant within the readout window $T_{ACQ}$, whereas the widely used twice refocused spin-echo (TRSE) method (Reese, MRM, 2003; 49:177) assumes that it decays monoexponentially, which is known not to be the case. Embodiments of the application propose a novel method that can dynamically correct for both $B_0^{SUSC}$- and time-varying $B_0^{EDDY}$-induced artifacts.

Methods

Figure 8:
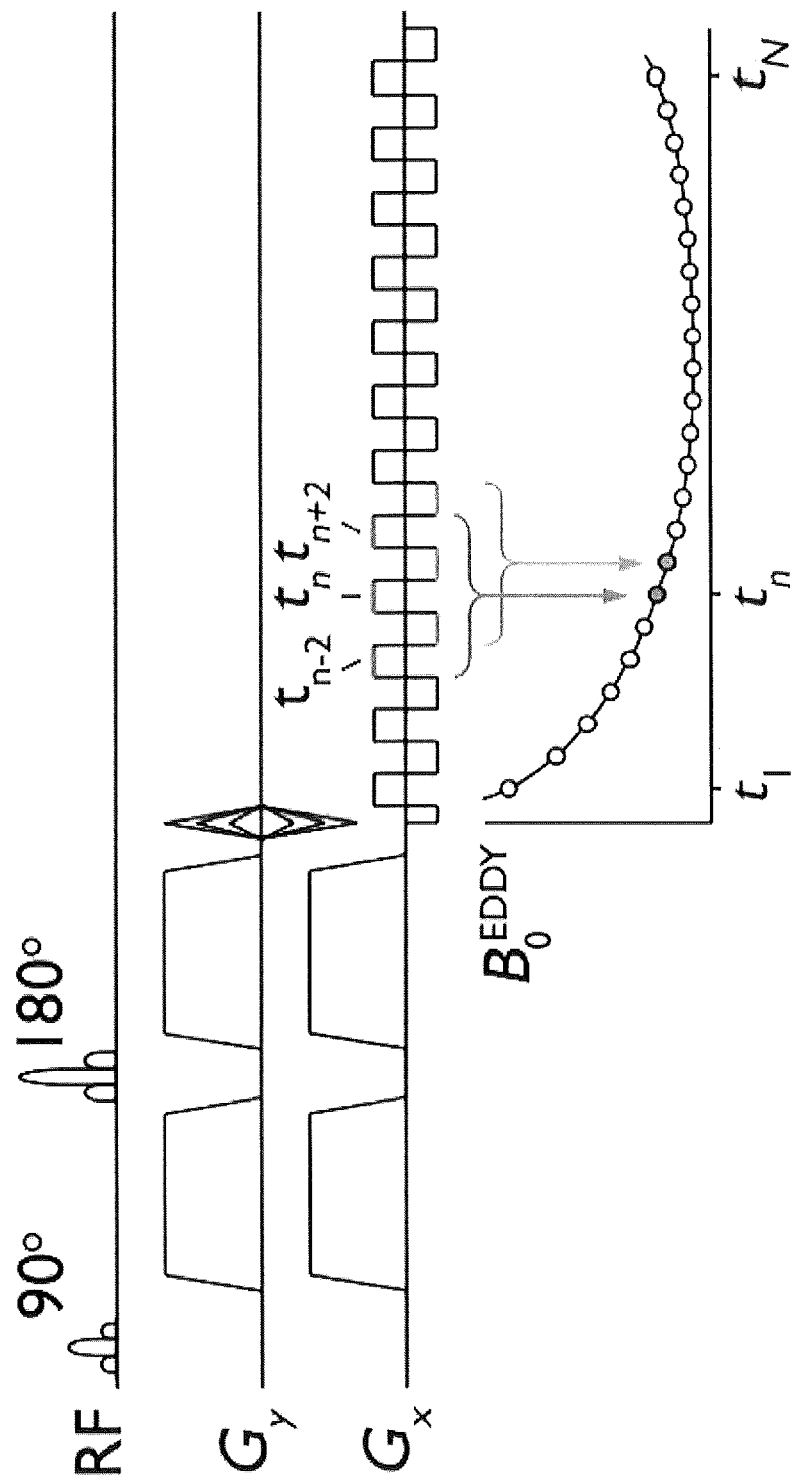
FIG. 8 is a schematic illustration of a dynamic $B_0^{EDDY}$ mapping pulse sequence according to embodiments of the present invention.

Dynamic $B_0^{EDDY}$ mapping is performed by acquiring a train of asymmetric spin-echo images at increasing TEs ($t_1, \ldots, t_N$) spanning $T_{ACQ}$ (FIG. 8). FIG. 8 shows an example of a dynamic $B_0^{EDDY}$ mapping pulse sequence. The phase images can be unwrapped along the TE dimension and, for each $t_n$, fitted with $\Phi(t) = \Phi_0(t_n) + \gamma B_0^{EDDY}(t_n) t$, where $\Phi_0$ is a constant, $\gamma$ is the gyromagnetic ratio, and t is a 3-point moving window $\{t_{n-2}, t_n, t_{n+2}\}$. This procedure is performed separately on odd and even echoes to avoid errors due to off-resonance effects. Since $B_0^{EDDY}$ varies slowly in space, the $B_0^{EDDY}$ maps are fitted with a $3^{rd}$ order polynomial function in space to improve the signal-to-noise ratio. Static $B_0^{SUSC}$ mapping is performed with the same pulse sequence by fitting all echoes instead of using a moving window.

Since $B_0^{EDDY}$ is subject-independent but diffusion direction-dependent, $B_0^{EDDY}$ mapping only needs to be performed once on a (spherical gel) phantom, but with the same scan parameters, e.g., diffusion-weighting scheme as the DTI scan. Conversely, since $B_0^{SUSC}$ is subject-dependent but diffusion-independent, $B_0^{SUSC}$ mapping is performed in vivo, but without diffusion-weighting. The $B_0^{EDDY}$ mapping can be carried out at set-up or installation of the Scanner, and/or quarterly, monthly, daily or at other desired intervals such as based on equipment service or repair. The $B_0^{EDDY}$ can be provided as a stored system resource used by subsequent clinical scans for patients.

Dynamic correction of $B_0^{SUSC}$- and $B_0^{EDDY}$-induced artifacts can then performed as follows. For each $t_n = t_1, \ldots, t_N$ corresponding to the acquisition a $k_y$ line in k-space, the uncorrected DTI image is multiplied by:

$$\exp[-i\Phi(x, t_n, d)], \text{ where } \Phi(x, t_n, d) = \gamma \int_0^{t_n} [B_0^{SUSC}(x) + B_0^{EDDY}(x, t, d)] dt \quad \text{(Equation 1).}$$

Figure 9:
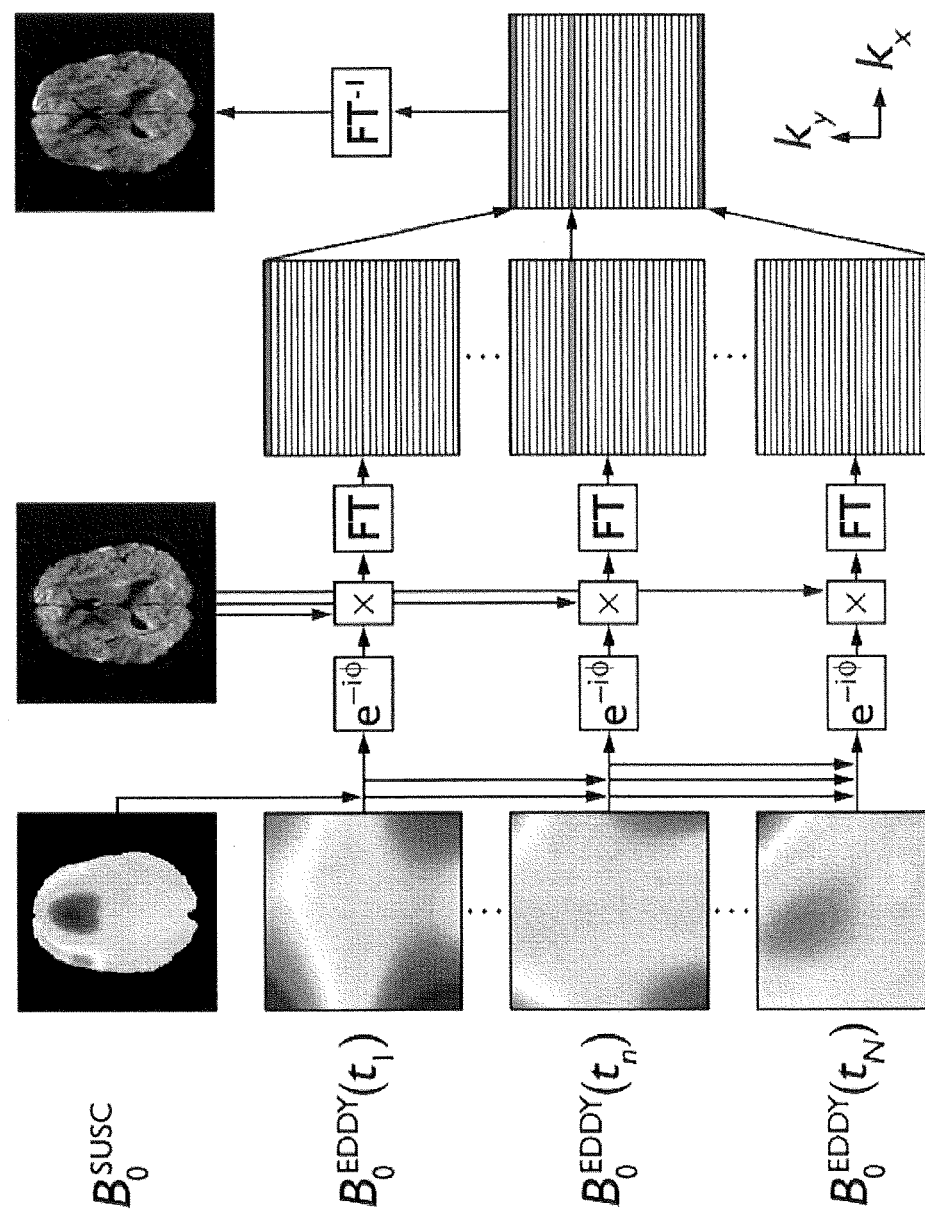
FIG. 9 is a schematic illustration of dynamic artifact correction according to embodiments of the present invention.

Each of these N images is Fourier transformed to k-space, and the $n^{th}$ $k_y$ line (acquired at time $t_n$) is extracted from the $n^{th}$ k-space to form a new k-space, which is then inverse Fourier transformed to yield the corrected image. FIG. 9 illustrates a dynamic correction of $B_0^{SUSC}$ and time-varying $B_0^{EDDY}$-induced artifacts.

Healthy volunteers were studied on a 3T GE scanner using TR=5s, TE=73 ms, matrix size=96×96, voxel size=$(2.5 \text{ mm})^3$, 5/8 partial Fourier, b=1000 s/mm², 15 diffusion directions, and $T_{ACQ}$=57 ms. For comparison with the proposed dynamic correction, a static correction was also performed using the $B_0^{SUSC}$ map as well as static $B_0^{EDDY}(x, d)$ maps computed by fitting all echoes instead of using a moving window.

Results and Discussion

Figure 10:
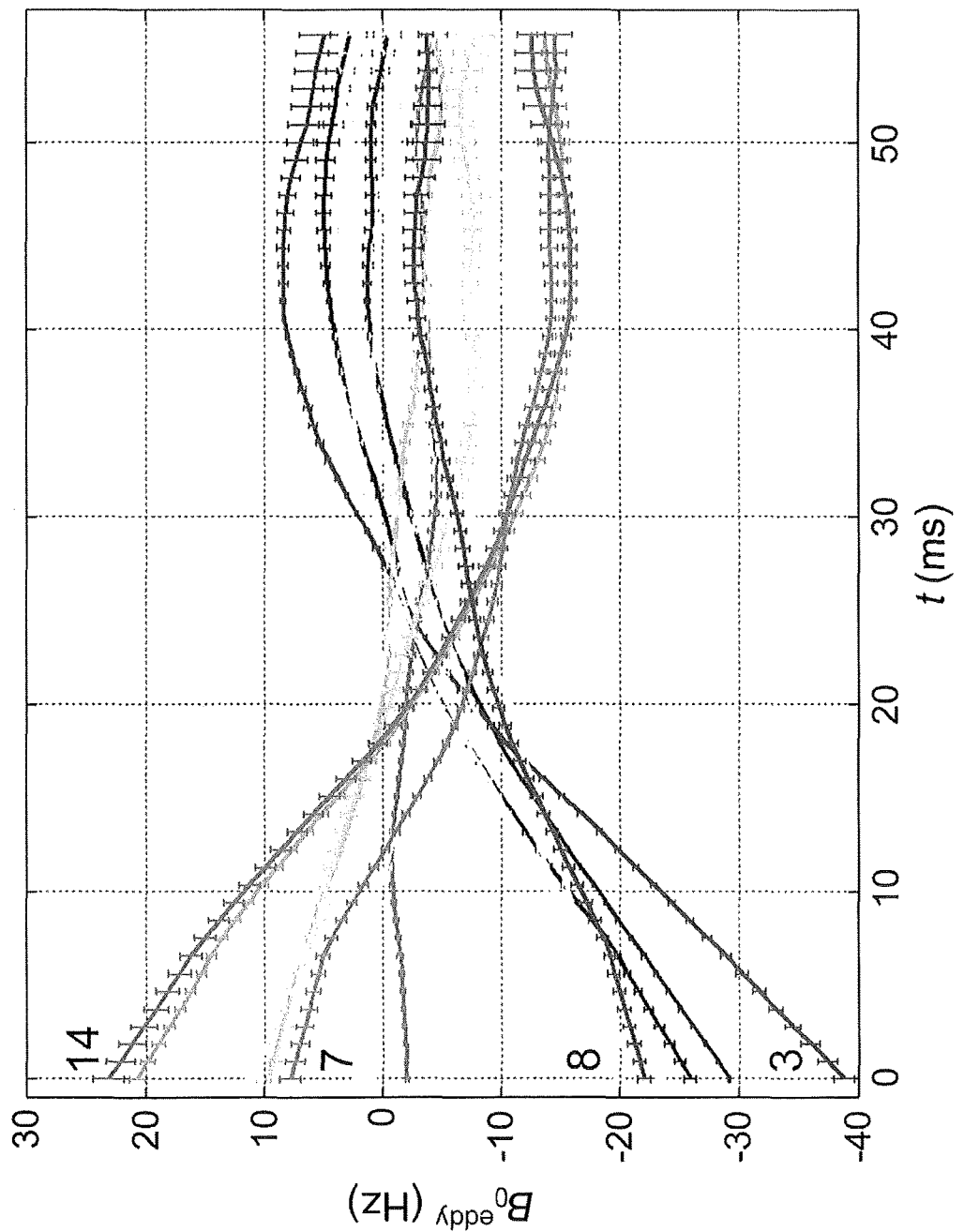
FIG. 10 is a graph of $B_0^{EDDY}$ versus time (ms) associated with $T_{ACQ}$ in a given voxel for 15 diffusion directions according to embodiments of the present invention.

Representative $B_0^{EDDY}$ time courses show that $B_0^{EDDY}$ varies significantly within $T_{ACQ}$ for all diffusion directions (FIG. 10). FIG. 10 is a graph that shows $B_0^{EDDY}$ time courses within $T_{ACQ}$ in a given voxel for 15 diffusion directions. Furthermore, the zero crossing clearly shows that it cannot be modeled as a single exponential decay, as assumed in the TRSE method, due to the presence of multiple eddy currents with different time constants.

Figure 11:
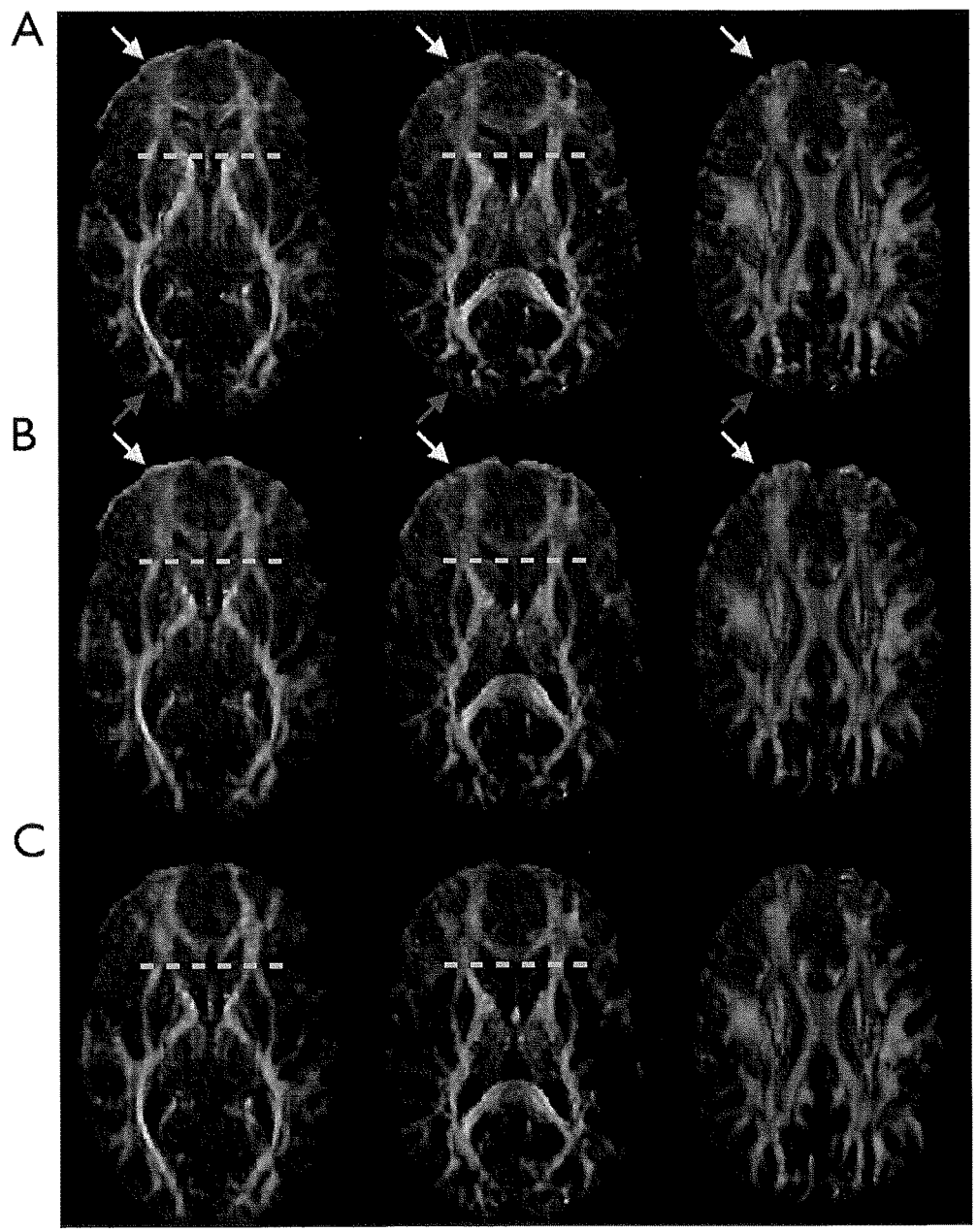
FIG. 11 shows color coded FA maps (in gray scale).

FIG. 11 shows color-coded FA maps. FIG. 11A has no correction. FIG. 11B has static correction. FIG. 11C has dynamic correction. The uncorrected FA maps show severe $B_0^{SUSC}$-induced distortions around the ventricles and the genu of the corpus callosum (FIG. 11A, dashed lines) as well as $B_0^{EDDY}$-induced FA errors at the anterior (brighter arrows) and posterior (darker arrows) edges of the brain. The static correction can only correct for the $B_0^{SUSC}$-induced distortions and the $B_0^{EDDY}$-induced FA errors at the posterior edge of the brain, but not at the anterior edge (FIG. 11B, arrows). On the other hand, the dynamic correction can effectively correct for all artifacts (FIG. 11C).

Figure 12:
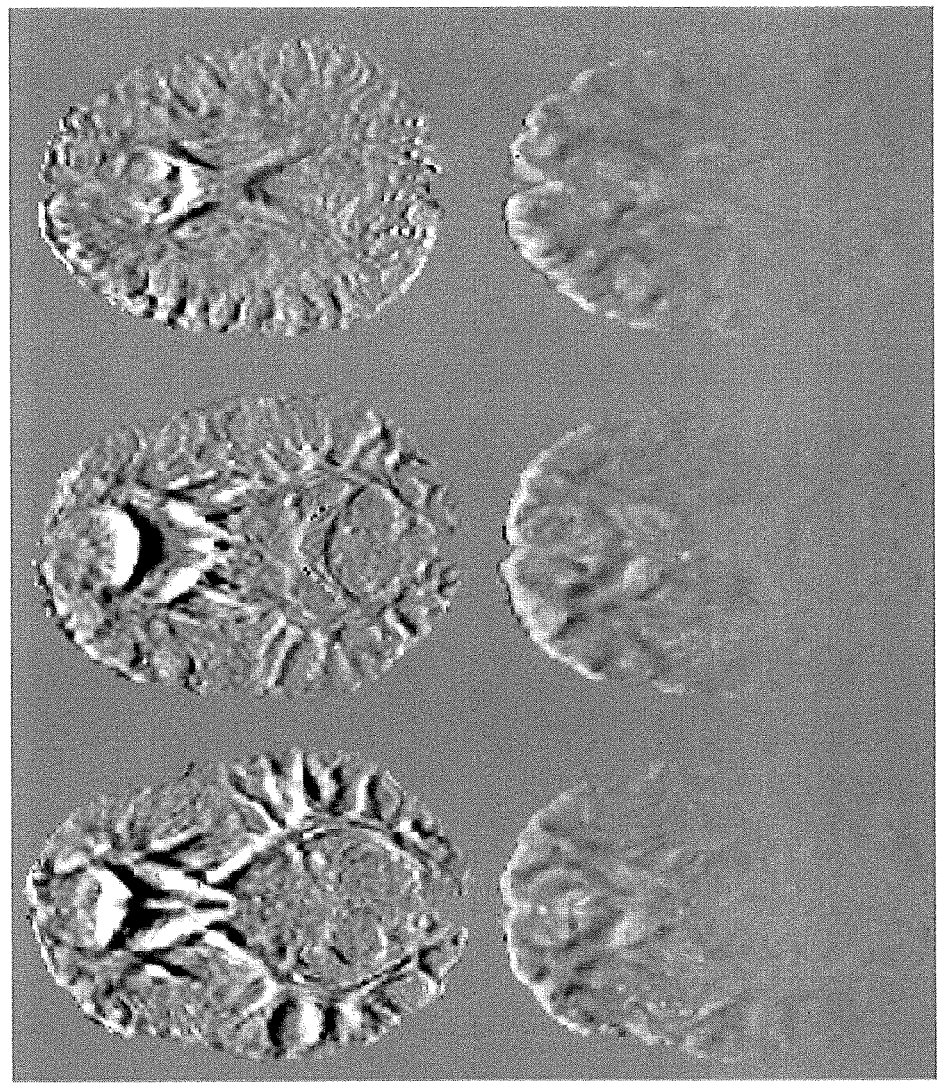
FIG. 12 shows FA difference maps with a scale of +/−0.3.

Although $B_0^{SUSC}$- and $B_0^{EDDY}$-induced artifacts may appear fairly localized, a subtraction between the uncorrected and corrected FA maps reveals that they are actually significant throughout the whole brain (FIG. 12A). Similarly, a comparison between the static and dynamic correction shows that residual $B_0^{EDDY}$-induced artifacts are still widespread and can result in up to 30% errors in FA values (FIG. 12B). FIG. 12 shows FA difference maps for no versus dynamic correction (FIG. 12A) and static versus dynamic correction (FIG. 12B) at a scale of +/−0.3.

These results demonstrate that it can be important to take into account the exact time dependence of $B_0^{EDDY}$ within $T_{ACQ}$ and that the proposed dynamic correction method can effectively correct for both $B_0^{SUSC}$- and $B_0^{EDDY}$-induced artifacts, without requiring any additional scan time as compared to existing static $B_0$ mapping methods (Chen, NeuroImage, 2006; 30:121 and Truong, NeuroImage, 2008; 40:53) and while providing a higher signal-to-noise ratio than the TRSE method.

Figure 13A:
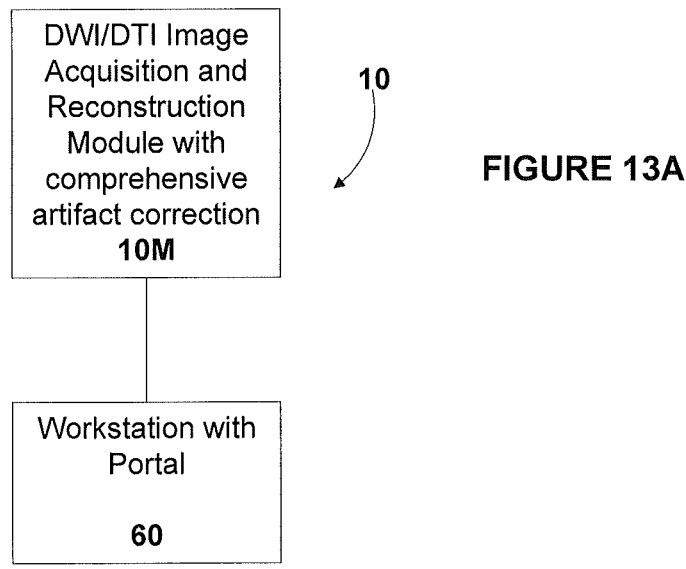
FIGS. 13A-13C are schematic illustrations of different systems that include or communicate with image processing circuits configured to carry out improved reconstruction to reduce artifact errors according to embodiments of the present invention.
Figure 13B:
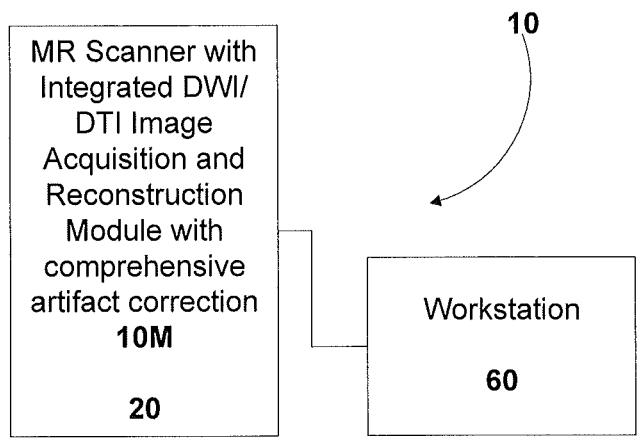
Figure 13C:
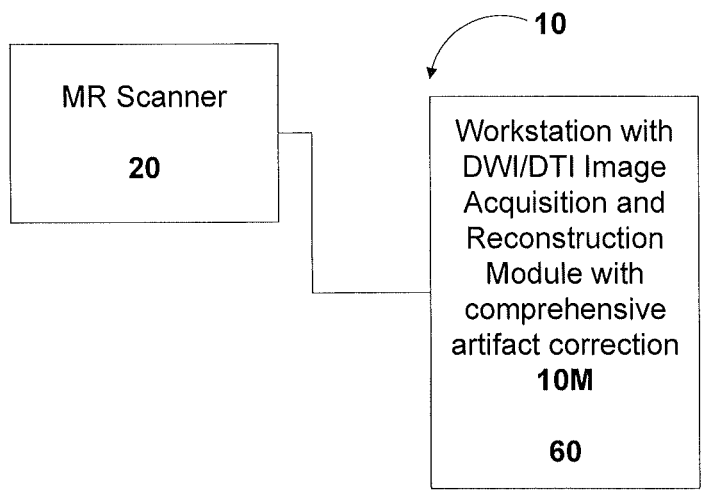

FIGS. 13A-13C illustrate exemplary image processing systems 10 with a DWI and/or DTI artifact correction module or circuit 10M.

FIG. 13A illustrates that the system 10 can include at least one workstation 60 that has a portal for accessing the module 10M. The module 10M can be held on a remote server accessible via a LAN, WAN or Internet. The workstation 60 can communicate with patient image data which may be held in a remote or local server, in the Scanner or other electronically accessible database or repository. The workstation 60 can include a display with a GUI (graphic user input) and the access portal. The workstation can access the data sets via a relatively broadband high speed connection using, for example, a LAN or may be remote and/or may have lesser bandwidth and/or speed, and for example, may access the data sets via a WAN and/or the Internet. Firewalls may be provided as appropriate for security.

FIG. 13B illustrates that the module 10M can be included in the MR Scanner 20 which can communicate with a workstation 60. The module 10M can be integrated into the control cabinet with image processing circuitry. FIG. 13C illustrates that the module 10M can be integrated into one or more local or remote workstations 60 that communicates with the Scanner 20. Although not shown, parts of the module 10M can be held on both the Scanner 20 and one or more workstations 60, which can be remote or local.

Figure 14:
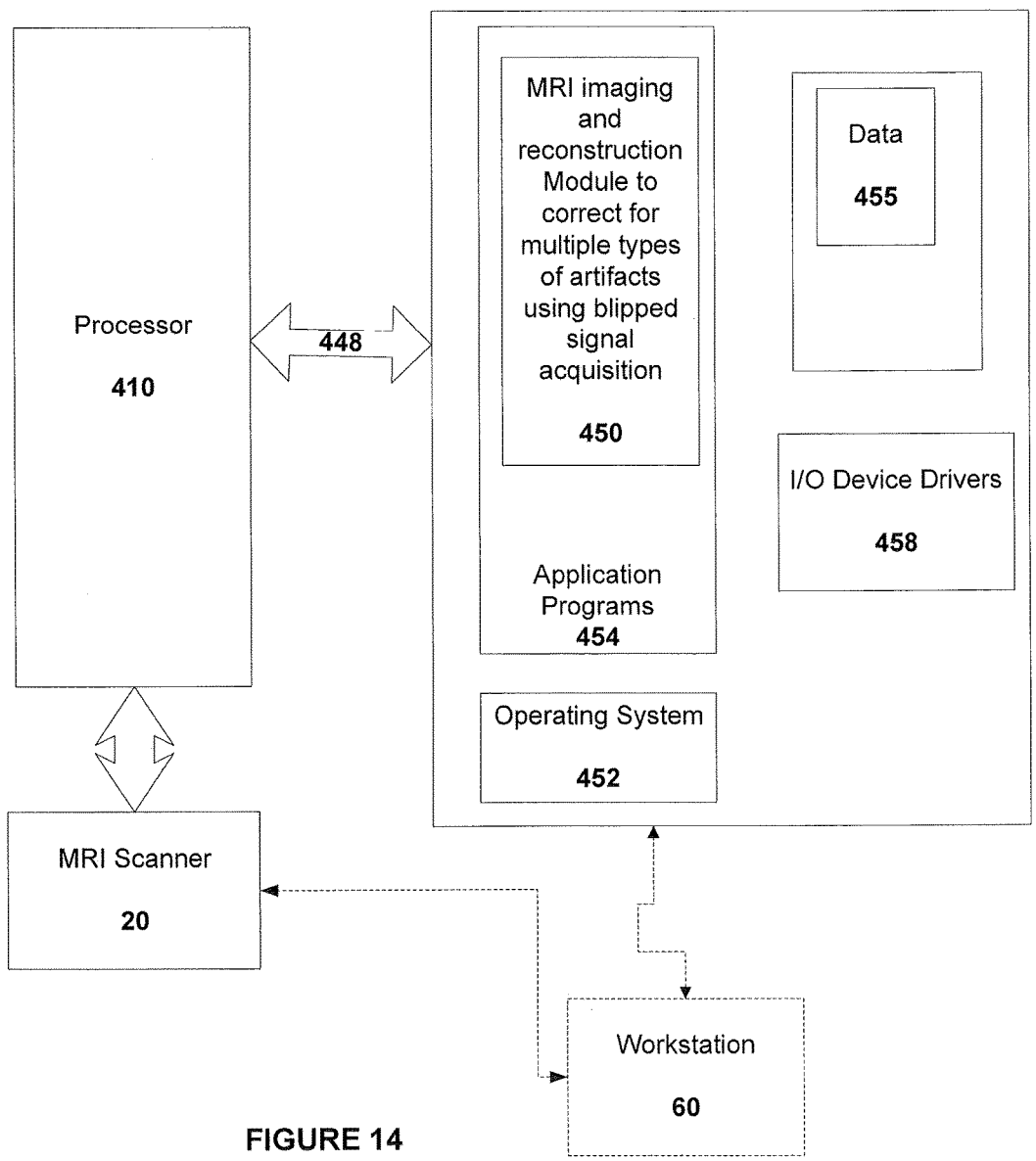
FIG. 14 is a schematic illustration of a data processing system according to embodiments of the present invention.

FIG. 14 is a schematic illustration of a circuit or data processing system 290. The system 290 can be used with any of the systems 10 and provide all or part of the module 10M. The circuits and/or data processing systems 290 data processing systems may be incorporated in a digital signal processor in any suitable device or devices. As shown in FIG. 14, the processor 410 can communicate with an MRI scanner 20 and with memory 414 via an address/data bus 448. The processor 410 can be any commercially available or custom microprocessor. The memory 414 is representative of the overall hierarchy of memory devices containing the software and data used to implement the functionality of the data processing system. The memory 414 can include, but is not limited to, the following types of devices: cache, ROM, PROM, EPROM, EEPROM, flash memory, SRAM, and DRAM.

FIG. 14 illustrates that the memory 414 may include several categories of software and data used in the data processing system: the operating system 452; the application programs 454; the input/output (I/O) device drivers 458; and data 455. The data 455 can include patient-specific MRI image data. FIG. 14 also illustrates the application programs 454 can include an image reconstruction Module 450 that can correct for multiple different artifact types including type 1, type 2 and type 3 artifacts. The Module 450 can include a set of defined gradient blips to be used for acquisition of patient signal data. This blip data can be pre-acquired using a phantom and pulse sequence protocols used for a clinical scan. The Module 450 can include a multischeme reconstruction protocol that uses a series of partial Fourier transforms of images with k-spaced data having the same matrix size (by using truncated or zero-filled k-space data segments). The Module 450 can include a dynamic magnetic field mapping and artifact correction analysis module and/or an echo time correction module. The data processing system may be particularly suitable for DWI/DTI imaging of the brain. It is contemplated that the corrected image data can be used for more accurate cortical neuronal activity images and/or white matter evaluation including FA (fractional anisotropy) images and/or fiber tractography images.

As will be appreciated by those of skill in the art, the operating systems 452 may be any operating system suitable for use with a data processing system, such as OS/2, AIX, DOS, OS/390 or System390 from International Business Machines Corporation, Armonk, N.Y., Windows CE, Windows NT, Windows95, Windows98, Windows2000, WindowsXP or other Windows versions from Microsoft Corporation, Redmond, Wash., Unix or Linux or FreeBSD, Palm OS from Palm, Inc., Mac OS from Apple Computer, LabView, or proprietary operating systems. The I/O device drivers 458 typically include software routines accessed through the operating system 452 by the application programs 454 to communicate with devices such as I/O data port(s), data storage 455 and certain memory 414 components. The application programs 454 are illustrative of the programs that implement the various features of the data (image) processing system and can include at least one application, which supports operations according to embodiments of the present invention. Finally, the data 455 represents the static and dynamic data used by the application programs 454, the operating system 452, the I/O device drivers 458, and other software programs that may reside in the memory 414.

While the present invention is illustrated, for example, with reference to the Module 450 being an application program in FIG. 14, as will be appreciated by those of skill in the art, other configurations may also be utilized while still benefiting from the teachings of the present invention. For example, the Module 450 may also be incorporated into the operating system 452, the I/O device drivers 458 or other such logical division of the data processing system. Thus, the present invention should not be construed as limited to the configuration of FIG. 14 which is intended to encompass any configuration capable of carrying out the operations described herein. Further, Module 450 can communicate with or be incorporated totally or partially in other components, such as an MRI scanner 20, interface/gateway or workstation 60.

The I/O data port can be used to transfer information between the data processing system, the workstation, the MRI scanner, the interface/gateway and another computer system or a network (e.g., the Internet) or to other devices or circuits controlled by the processor. These components may be conventional components such as those used in many conventional data processing systems, which may be configured in accordance with the present invention to operate as described herein.

Figure 15:
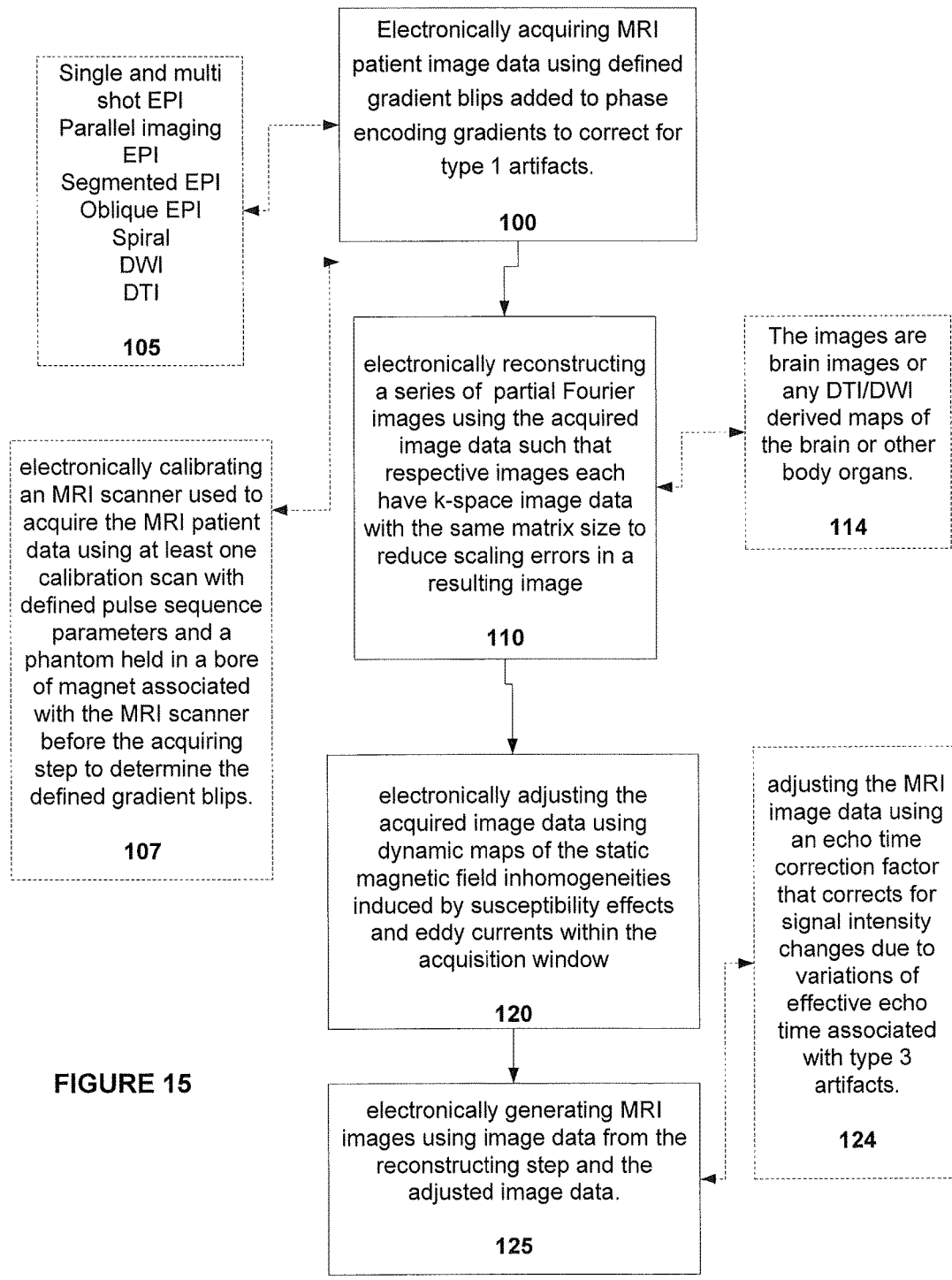
FIG. 15 is a flow chart of exemplary operations that can be used to carry out actions or methods contemplated by embodiments of the present invention to reduce artifact errors in MR images.

FIG. 15 is a flow chart of exemplary actions that can be used to carry out methods according to embodiments of the present invention. To generate MRI images, MRI patient image data can be electronically acquired using defined gradient blips added to phase encoding gradients to correct for type 1 artifacts (block 100). A series of partial Fourier images can be reconstructed using the acquired image data such that respective images each have k-space image data with the same matrix size to reduce scaling errors in a resulting image (block 110).

The acquired image data can be electronically adjusted by processing data using dynamic maps of the static magnetic field inhomogeneities induced by susceptibility effects and eddy currents within the acquisition window (block 120). MRI images can be electronically generated using image data from the reconstructing step and the adjusted image data (block 125).

In some embodiments, the method can optionally include electronically calibrating an MRI scanner used to acquire the MRI patient data using at least one calibration scan with defined pulse sequence parameters and a phantom held in a bore of magnet associated with the MRI scanner before the acquiring step to determine the defined gradient blips (block 107).

It is contemplated that the acquisition and reconstruction protocols can be widely used but may be particularly suitable for single and multi shot EPI, parallel imaging EPI, segmented EPI, oblique EPI, spiral imaging, DWI and DTI (block 105). The generated images can be brain images including FA and FA difference map images and other images of the brain, or any DWI/DTI data derived maps from other body tissue or organs (block 114).

In some embodiments, the images can also be generated after adjusting the MRI image data using an echo time correction factor that corrects for signal intensity changes due to variations of effective echo time associated with type 3 artifacts (block 124).

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed:

1. A method configured for generating MRI images using an image processing system with a DWI and/or DTI artifact correction circuit, comprising:

electronically acquiring diffusion-weighted MRI patient image data using calibration-scan defined gradient blips added to phase encoding gradients of a partial-Fourier echo-planar imaging (EPI) pulse sequence to acquire the diffusion-weighted MRI patient image data in order to reduce or correct for type 1 artifacts, wherein type 1 artifacts are artifacts due to signal loss associated with when an echo is shifted outside an acquired k-space;

electronically mathematically reconstructing a series of partial-Fourier diffusion-weighted EPI images using the acquired diffusion-weighted MRI patient image data with background phases estimated from different portions of k-space then combining the reconstructed partial-Fourier diffusion-weighted EPI images on a voxel by voxel basis in order to generate a composite image where the voxel by voxel basis results in a voxel-wise signal extracted from each of the series of reconstructed partial-Fourier diffusion weighted EPI images with a background-phase-estimating k-space portion from each of the reconstructed series of partial-Fourier diffusion-weighted EPI images matching a corresponding local echo-shifting effect in order to remove type 2 artifacts, wherein type 2 artifacts are artifacts due to partial Fourier reconstruction errors when an echo is shifted outside a central k-space band from which the background phase is computed;

providing patient-independent and diffusion direction-dependent $B_0^{EDDY}$ maps of changes of $B_0$ values due to diffusion gradient induced eddy current of a MR scanner used to acquire the diffusion-weighted MRI patient image data, wherein the $B_0^{EDDY}$ maps are acquired using a phantom and can be provided as a stored resource of the MR scanner, and wherein $B_0^{EDDY}$ refers to changes of $B_0$ values due to diffusion gradient induces eddy current;

generating in vivo patient-dependent and diffusion-independent $B_0^{SUSC}$ maps of changes of $B_0$ value due to patient-dependent tissue susceptibility effect with the patient in the MR scanner, wherein $B_0^{SUSC}$ refers to changes of the $B_0$ values due to patient-dependent tissue susceptibility effect;

electronically mathematically removing geometric distortions in the acquired diffusion-weighted MRI patient image data in post-processing using the $B_0^{EDDY}$ maps and $B_0^{SUSC}$ maps; and electronically generating MRI images using the composite image of the combined reconstructed partial-Fourier EPI images and the removed geometric distortions thereby generating MRI images corrected for type 1 and type 2 artifacts.

2. The method of claim 1, wherein the providing patient-independent and diffusion direction-dependent $B_0^{EDDY}$ maps comprises generating the calibration scan using the MRI scanner that was used to acquire the diffusion-weighted MRI patient image data with defined pulse sequence parameters and the phantom being held in a bore of a magnet associated with the MRI scanner before the electronic acquiring step of claim 1 in order to provide the defined gradient blips, and wherein the defined gradient blips also locate partial-Fourier EPI acquisition windows such that a shifted echo remains in an acquired k-space in order to thereby reduce or correct for type 1 artifacts related to artificial signal loss in partial-Fourier diffusion-weighted EPI data associated with eddy current related k-space energy displacement.

3. The method of claim 2, wherein the gradient blips are determined using a k-space energy spectrum analysis in order to measure Δky that varies with diffusion direction and slice number associated with eddy current-induced echo shifts in k-space data.

4. The method of claim 2, wherein the providing patient-independent and diffusion direction-dependent $B_0^{EDDY}$ maps further comprises:

acquiring a series of asymmetric spin-echo EPI data sets, and calculating a temporal dependence of static magnetic field inhomogeneities induced by susceptibility effects and eddy currents within the acquisition window using the phantom, wherein the calculated temporal dependence is used to remove the geometric distortions of the acquired diffusion-weighted MRI patient image data in post processing of the acquired data.

5. The method of claim 1, further comprising electronically applying a TE (echo time) correction to the acquired data by dividing a signal intensity of each pixel of the generated composite image by a correction factor in order to thereby correct for type 3 artifacts, wherein type 3 artifacts are artifacts due to variations of an effective echo time so that an acquired echo is an asymmetric spin-echo rather than a pure spin-echo.

6. The method of claim 1, wherein the generating the MRI images comprises generating a fractional anisotropy (FA) image of a brain of the patient as one or more of the generated MRI images whereby the FA image is free of type 1 artifacts, type 2 artifacts, type 3 artifacts and EPI geometric distortions, and
wherein type 3 artifacts are artifacts due to variations of an effective echo time so that an acquired echo is an asymmetric spin-echo rather than a pure spin-echo.

7. The method of claim 1, wherein the generating the MRI images comprises generating a fiber tractography of a brain of the patient as one or more of the generated MRI images whereby the fiber tractography image is free of type 1 artifacts, type 2 artifacts, type 3 artifacts and geometric distortions, and wherein type 3 artifacts are artifacts due to variations of an effective echo time so that an acquired echo is an asymmetric spin-echo rather than a pure spin-echo.

8. The method of claim 1, wherein the $B_0^{EDDY}$ and maps are generated by acquiring a train of asymmetric spin-echo images using an asymmetric spin-echo sequence with increasing echo times (TEs) spanning an acquisition time period ($T_{acq}$) using a moving window, wherein the electronically mathematically removing geometric distortions further comprises, after the train of asymmetric spin-echo images are acquired, unwrapping phase values of the asymmetric spin-echo images along a TE (echo time) dimension, wherein the unwrapping is performed separately on odd and even echoes of the asymmetric spin-echo sequence in order to thereby avoid errors due to off-resonance effects, and wherein the unwrapped phase values quantify the field inhomogeneities due to the susceptibility effect and the eddy current effect.

9. The method of claim 1, wherein the geometric distortions are removed by multiplying uncorrected geometrically distorted EPI images with defined exponential phase-correction functions in order to generate phase-corrected images, then Fourier transforming the phase-corrected images to k-space, then extracting data from the transformed images in order to define a new k-space that is then used in order to generate a corrected EPI image with the removed geometric distortions.

10. The method of claim 5, wherein the applied TE correction divides signal intensity of each pixel of the composite image by an exponential function for the correction factor that is either
$\exp(-\Delta TE/T_2^*)$ or
$\exp(-\Delta TE/T_2^-)$,
depending on a polarity of $\Delta ky$,
where $\Delta ky$ is obtained from a $\Delta ky$ map,
wherein the exponential function is based on eddy current induced echo shift,
wherein the exponential function is associated with echo location affected by eddy current induced echo shift with on either side of an effective echo location associated with a central line of acquisition window associated with a target TE, and
wherein an acquired echo is an asymmetric echo with an additional $T_2^*$ weighting relative to a pure spin-echo.

11. An image processing circuit configured to electronically generate MRI images with reduced artifacts by using blipped gradient image acquisitions with an MR Scanner in order to acquire MRI patient image data along with a reconstruction and correction protocol that:
(a) generates
(i) a series of reconstructed partial-Fourier transform (PFT) diffusion- weighted EPI images using the acquired MRI patient image data with background phases estimated from different portions of k-space, wherein the PFT of the images is configured to create k-space images with the same matrix size and then
(ii) a composite image using the reconstructed PFT diffusion weighted EPI images that have been corrected in order to remove or reduce type 2 artifacts,
wherein type 2 artifacts are artifacts due to partial Fourier reconstruction errors when an echo is shifted outside a central k- space band from which the background phase is computed;
(b) applies a TE (echo time) correction factor to the acquired MRI image data in order to reduce type 3 artifacts,
wherein the applied TE correction factor corrects for signal intensity changes due to variations of an effective echo time associated with type 3 artifacts,
wherein type 3 artifacts are artifacts due to variations of an effective echo time so that an acquired echo is an asymmetric spin-echo rather than a pure spin-echo, and
wherein the TE correction factor divides signal intensity of each pixel of the generated composite image by an exponential function that is either
$\exp(-\Delta TE/T_2^*)$ or
$\exp(-\Delta TE/T_2^-)$,
depending on a polarity of $\Delta ky$, and where $\Delta ky$ varies with both diffusion direction and slice number; and
(c) corrects diffusion-weighted EPI geometric distortions resulting from spatial and temporal variations of a static magnetic field associated with a magnet of the MR Scanner, including those due to susceptibility effects and time-varying eddy currents,
wherein the eddy current corrections use pre-acquired measures of temporal variations based on a dynamic mapping of the static magnetic field, and
wherein the pre-acquired measures of temporal variations are calculated using phase values determined by using an asymmetric spin-echo sequence with increasing echo times (TEs) spanning an acquisition time period ($T_{acq}$) while using a moving window.

12. The circuit of claim 11, wherein the circuit is at least partially integrated into, or in communication with, at least one of: (a) the MR Scanner; or (b) a clinician workstation.

13. The circuit of claim 11, wherein the circuit is configured to generate a fractional anisotropy (FA) image and/or a fiber tractography of a brain or other body organ of the patient based on the combination of both the reconstruction and correction protocol.

14. The circuit of claim 11, wherein the acquired MRI images are DWI and/or DTI images.

15. An MR image processing system, comprising:
an MR Scanner configured with defined gradient blips that have been previously obtained from a calibration scan using a phantom;
wherein the defined gradient blips of the MR scanner are then used in the MR image processing system in one or more signal acquisitions of partial-Fourier EPI based DTI and/or DWI clinical images in order to thereby reduce type 1 artifacts occurring within the resulting acquired partial-Fourier EPI based DTI and/or DWI clinical images,
wherein type 1 artifacts are artifacts due to signal loss associated with when an echo is shifted outside an acquired k-space, and
wherein the defined gradient blips are added to phase encoding gradients of a partial-Fourier echo-planar imaging (EPI) pulse sequence during the one or more signal acquisitions that produce and provide the resulting acquired partial-Fourier EPI based DTI and/or DWI clinical images.

16. The system of claim 15, wherein the defined gradient blips also locate partial-Fourier EPI acquisition windows such that a shifted echo remains in an acquired k-space and thereby remove type 1 artifacts related to artificial signal loss in partial-Fourier diffusion-weighted EPI data that is associated with eddy current related k-energy displacement.

17. The MR image processing system of claim 15,
wherein the MR Scanner is configured with data from a dynamic field mapping of a static magnetic field of the MR Scanner in order to provide measures of temporal variations associated with eddy current induced artifacts using the phantom and defined gradient blips that are part of the partial-Fourier EPI based DTI and/or DWI image acquisition parameters,
wherein the measures of temporal variations comprise:
phase values calculated using an asymmetric spin-echo sequence with increasing echo times (TEs) spanning an acquisition time period ($T_{acq}$) using a moving window, and
wherein the measures of temporal variations are used in order to remove EPI geometric distortions from the resulting acquired partial-Fourier EPI based DTI and/or DWI clinical images.

18. The MR image processing system of claim 15, further comprising:
a workstation in communication with the MR Scanner, wherein the workstation and/or Scanner is configured with an image processing circuit, and wherein the image processing circuit applies a reconstruction and correction protocol that:
(a) generates a composite partial-Fourier EPI based DTI and/or DWI clinical image with reduced type 2 artifacts by electronically combining a series of partial Fourier transform (PFT) of images of acquired partial-Fourier EPI based DTI and/or DWI MRI patient image data in order to create a composite image with reduced type 2 artifacts, wherein type 2 artifacts are artifacts due to partial Fourier reconstruction errors when an echo is shifted outside a central k-space band;
(b) applies a TE (echo time) correction factor to the acquired MRI image data in order to reduce type 3 artifacts,
wherein the applied TE correction factor corrects signal intensity changes due to variations of an effective echo time associated with type 3 artifacts,
wherein type 3 artifacts are due to variations of said effective echo time so that an acquired echo is an asymmetric spin-echo rather than a pure spin-echo, and
wherein the applied TE correction factor also divides signal intensity of each pixel of the generated composite image by an exponential function that is either exp(-$\Delta$TE/$T_2^*$) or exp(-$\Delta$TE/$T_2^-$), depending on a polarity of $\Delta k_y$, where $\Delta k_y$ varies with diffusion direction and slice number; and
(c) corrects for spatial and temporal variations of a static magnetic field associated with a magnet of the MR Scanner including those due to susceptibility effects and eddy current by using pre-acquired measures of temporal variations associated with eddy currents,
wherein the pre-acquired measures of temporal variations are determined from a calibration scan, by using:
a phantom in the MR Scanner and
a train of asymmetric spin-echo images at increasing echo times (TEs) from a dynamic $B_0^{Eddy}$ mapping pulse sequence, and wherein the image processing circuit also uses the pre-acquired measures of temporal variations when removing EPI geometric distortions from the resulting acquired partial-Fourier EPI based DTI and/or DWI clinical images.

19. The MR image processing system of claim 17, wherein the MR Scanner is further configured to generate a fractional anisotropy (FA) image and/or a fiber tractography of a brain as at least one of the DTI and/or DWI clinical images that are acquired by using the defined gradient blips during the one or more acquired DTI/DWI signal acquisitions that produce and provide the resulting acquired partial-Fourier EPI based DTI and/or DWI clinical images.

20. The system of claim 15, wherein the defined gradient blips are determined by using a k-space energy spectrum analysis in order to measure $\Delta k_y$ that varies with diffusion direction and a slice number associated with eddy current-induced echo shifts that occur within acquired k-space data.

21. A method of generating partial-Fourier echo planar imaging (EPI) based clinical DWI and/or DTI MRI brain images using an image processing system with a DWI and/or DTI artifact correction circuit, comprising:
acquiring MRI image data of a brain of a patient using a partial-Fourier EPI pulse sequence with pre-defined gradient blips, one pre-defined gradient blip is added to each of a first phase-encoding gradient of an EPI readout gradient thereby adjusting acquisition windows of the partial-Fourier EPI pulse sequence in order to correct for type 1 artifacts related to artificial signal loss in the acquired partial-Fourier diffusion-weighted EPI data associated with eddy current related k-energy displacement, wherein type 1 artifacts are artifacts due to signal loss associated with when an echo is shifted outside an acquired k-space, and wherein the pre-defined gradient blips adjust respective readout gradient acquisition windows so that a shifted echo remains in an acquired k-space;
reconstructing the acquired MRI image data using a series of partial Fourier images in order to generate a composite image that is currently adjusted to reduce type 2 artifacts, wherein type 2 artifacts are artifacts due to partial Fourier reconstruction errors when an echo is shifted outside a central k-space band;
adjusting the acquired MRI image data using an echo time correction factor that corrects for signal intensity changes due to variations of effective echo time associated with type 3 artifacts, wherein type 3 artifacts are artifacts due to variations of an effective echo time so that an acquired echo is an asymmetric spin-echo rather than a pure spin-echo, and wherein the TE correction factor divides signal intensity of each pixel of the composite image by an exponential function that is either:
exp(-$\Delta$TE/$T_2^*$) or
exp(-$\Delta$TE/$T_2^-$),
depending on a polarity of $\Delta k_y$, where $\Delta k_y$ varies with diffusion direction and slice number;
correcting the composite image for diffusion-weighted EPI geometric distortions using data from a previously obtained dynamic magnetic field mapping of measures of spatial and temporal variations of the magnetic field associated with susceptibility effects and eddy currents; and
generating brain images of the patient using the reconstructed and corrected image data.

* * * * *

UNITED STATES PATENT AND TRADEMARK OFFICE
CERTIFICATE OF CORRECTION

PATENT NO. : 10,168,410 B2  
APPLICATION NO. : 13/992537  
DATED : January 1, 2019  
INVENTOR(S) : Chen et al.

Page 1 of 1

It is certified that error appears in the above-identified patent and that said Letters Patent is hereby corrected as shown below:

On the Title Page

Item (54) Title: Please correct "Imagine" to read -- Imaging --

In the Specification

Column 1, Line 4: Please correct "Imagine" to read -- Imaging --

Column 12, Line 19: Please correct "ATE" to read -- $\Delta TE$ --

Column 14, Line 15: Please correct "$B_0^{SUSC}$ and" to read -- $B_0^{SUSC}$ -and --

Column 14, Line 61: Please correct "$B_o$" to read -- $B_0$ --

In the Claims

Column 17, Line 65, Claim 1: Please correct "when" to read -- if --

Column 18, Line 8, Claim 1: Please correct "value" to read -- values --

Column 18, Line 9, Claim 1: Please correct "induces" to read -- induced --

Column 19, Line 1, Claim 6: Please correct "wherein the generating" to read -- wherein generating --

Signed and Sealed this  
Ninth Day of April, 2019

Andrei Iancu  
*Director of the United States Patent and Trademark Office*